(12) United States Patent
Kim et al.

(10) Patent No.: US 12,159,938 B2
(45) Date of Patent: Dec. 3, 2024

(54) SEMICONDUCTOR DEVICE

(71) Applicant: SAMSUNG ELECTRONICS CO., LTD., Suwon-si (KR)

(72) Inventors: Hyojin Kim, Hwaseong-si (KR); Sangmoon Lee, Suwon-si (KR); Jinbum Kim, Seoul (KR); Yongjun Nam, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 435 days.

(21) Appl. No.: 17/711,914

(22) Filed: Apr. 1, 2022

(65) Prior Publication Data
US 2022/0416086 A1    Dec. 29, 2022

(30) Foreign Application Priority Data
Jun. 29, 2021    (KR) .................. 10-2021-0084802

(51) Int. Cl.
*H01L 29/786*    (2006.01)
*H01L 21/02*    (2006.01)
(Continued)

(52) U.S. Cl.
CPC .... *H01L 29/78618* (2013.01); *H01L 21/0259* (2013.01); *H01L 21/26513* (2013.01);
(Continued)

(58) Field of Classification Search
CPC ........... H01L 29/66439; H01L 29/7851; H01L 29/775; H01L 29/66545; H01L 29/78696; H01L 29/7854; H01L 29/0673; H01L 29/4232; H01L 29/1079; H01L 29/42392; H01L 29/78618; H01L 21/0259; H01L 21/26513; H01L 21/823807; H01L 21/823814; H01L 21/823871; H01L 21/823892; H01L 27/092; H01L 29/41733; H01L 29/66742; H01L 29/41725; H01L 29/0847; H01L 21/823493;
(Continued)

(56) References Cited

U.S. PATENT DOCUMENTS 10,692,778 B2    6/2020    Bao et al.
10,804,410 B2    10/2020   Chao et al.
(Continued)

FOREIGN PATENT DOCUMENTS

JP    2014038988 A    2/2014

*Primary Examiner* — Wasiul Haider
(74) *Attorney, Agent, or Firm* — Fish & Richardson P.C.

(57) ABSTRACT

A semiconductor device includes; a first fin vertically protruding from a substrate and extending in a first horizontal direction, a second fin vertically protruding from the substrate, an isolation layer contacting side surfaces of the first fin and the second fin, a first lower barrier layer on the first fin, a second lower barrier layer on the second fin, source/drain regions spaced apart in the first horizontal direction on the first lower barrier layer, channel layers disposed between the source/drain regions and vertically spaced apart on the first barrier layer, a gate structure intersecting the first lower barrier layer, surrounding each of the channel layers, and extending in a second horizontal direction, an upper barrier layer on the second lower barrier layer, and first semiconductor layers and second semiconductor layers stacked on the upper barrier layer.

20 Claims, 22 Drawing Sheets

(51) Int. Cl.
*H01L 21/265* (2006.01)
*H01L 21/8238* (2006.01)
*H01L 27/092* (2006.01)
*H01L 29/06* (2006.01)
*H01L 29/417* (2006.01)
*H01L 29/423* (2006.01)
*H01L 29/66* (2006.01)

(52) U.S. Cl.
CPC ............... *H01L 21/823807* (2013.01); *H01L 21/823814* (2013.01); *H01L 21/823871* (2013.01); *H01L 21/823892* (2013.01); *H01L 27/092* (2013.01); *H01L 29/0665* (2013.01); *H01L 29/41733* (2013.01); *H01L 29/42392* (2013.01); *H01L 29/66545* (2013.01); *H01L 29/66742* (2013.01); *H01L 29/78696* (2013.01)

(58) Field of Classification Search
CPC ..... H01L 21/823481; H01L 21/823412; H01L 21/823418; H01L 21/823437; H01L 21/823462; H01L 27/088; H01L 29/0665; H01L 29/0669; B82Y 10/00
See application file for complete search history.

(56) References Cited

U.S. PATENT DOCUMENTS

| | | |
|---|---|---|
| 10,833,084 B2 | 11/2020 | Ching et al. |
| 2015/0214355 A1 | 7/2015 | Nakano et al. |
| 2020/0044087 A1* | 2/2020 | Guha ............ H01L 21/823821 |
| 2020/0105872 A1 | 4/2020 | Glass et al. |
| 2020/0411641 A1 | 12/2020 | Noh et al. |
| 2020/0411698 A1 | 12/2020 | Kim et al. |
| 2022/0238649 A1* | 7/2022 | Lee .................... H01L 29/0673 |

* cited by examiner

'A'

SEMICONDUCTOR DEVICE

CROSS-REFERENCE TO RELATED APPLICATION

This application claims priority under 35 U.S.C. § 119 to Korean Patent Application No. 10-2021-0084802 filed on Jun. 29, 2021 in the Korean Intellectual Property Office, the subject matter of which is hereby incorporated by reference in its entirety.

BACKGROUND

The inventive concept relates generally to semiconductor devices.

As demand for high performance, high speed, and/or highly functional semiconductor devices increases, the degree of integration of semiconductor devices also increases. Accordingly, many contemporary and emerging semiconductor devices include very fine micropatterns characterized by exceptionally narrow width(s) and/or a very close separation distance(s). Furthermore, in order to overcome certain limitation(s) in the operating characteristics of planar metal-oxide-semiconductor field-effect transistors (FETs) (MOSFETs), semiconductor devices including Fin-type FETs (FinFETs) have been developed. In this regard, FinFETs include a channel having a three-dimensional structure.

SUMMARY

Embodiments of the inventive concept provide semiconductor devices characterized by more dense integration density. Embodiments of the inventive concept also provide semiconductor devices exhibiting markedly reduced leakage current from source/drain regions.

In one aspect of the inventive concept, a semiconductor device may include; a first fin vertically protruding from a substrate and extending in a first horizontal direction, a second fin vertically protruding from the substrate, an isolation layer contacting side surfaces of the first fin and the second fin, a first lower barrier layer on the first fin, a second lower barrier layer on the second fin, source/drain regions spaced apart in the first horizontal direction on the first lower barrier layer, channel layers disposed between the source/drain regions and vertically spaced apart on the first barrier layer, a gate structure intersecting the first lower barrier layer, surrounding each of the channel layers, and extending in a second horizontal direction, an upper barrier layer on the second lower barrier layer, and alternately stacked first semiconductor layers and second semiconductor layers on the upper barrier layer.

In another aspect of the inventive concept, a semiconductor device may include; a fin protruding from a substrate, a lower barrier layer on the fin, source/drain regions spaced apart on the lower barrier layer in a first horizontal direction, and separated from the fin by the lower barrier layer, channel layers disposed between the source/drain regions and vertically spaced apart on the lower barrier layer, a gate structure including a lower gate portion contacting a lowermost one of the channel layers, and the lower barrier layer between the lowermost one of the channel layers and the lower barrier layer, a middle gate portion disposed between adjacent ones of the channel layers, and an upper gate portion disposed on an uppermost one of the channel layers, and contact plugs on the source/drain regions, wherein the lower barrier layer includes a first material different from a second material of the channel layers and a third material of the fin.

In another aspect of the inventive concept, a semiconductor device may include; a fin protruding from a substrate, a lower barrier layer on the fin, source/drain regions spaced apart in a first horizontal direction on the lower barrier layer and separated from the fin by the lower barrier layer, channel layers disposed between the source/drain regions and vertically spaced apart on the lower barrier layer, a gate structure including a lower gate portion contacting a lowermost one of the channel layers and contacting the lower barrier layer between the lowermost one of the channel layers, a middle gate portion disposed between adjacent ones of the channel layers, and an upper gate portion disposed on an uppermost one of the channel layers; and contact plugs on the source/drain regions, wherein an upper surface of the lower barrier layer has a wavy shape.

BRIEF DESCRIPTION OF DRAWINGS

The above and other aspects, features, and advantages associated with embodiments of the inventive concept may be clearly understood upon consideration of the following detailed description together with the accompanying drawings, in which.

DETAILED DESCRIPTION

Throughout the written description and drawings, like reference numbers and labels are used to denote like or similar elements, components and/or features. Throughout the written description certain geometric terms may be used to highlight relative relationships between elements, components and/or features with respect to certain embodiments of the inventive concept. Those skilled in the art will recognize that such geometric terms are relative in nature, arbitrary in descriptive relationship(s) and/or directed to aspect(s) of the illustrated embodiments. Geometric terms may include, for example: height/width; vertical/horizontal; top/bottom; higher/lower; closer/farther; thicker/thinner; proximate/distant; above/below; under/over; upper/lower; center/side; surrounding; overlay/underlay; etc.

Figure 1:
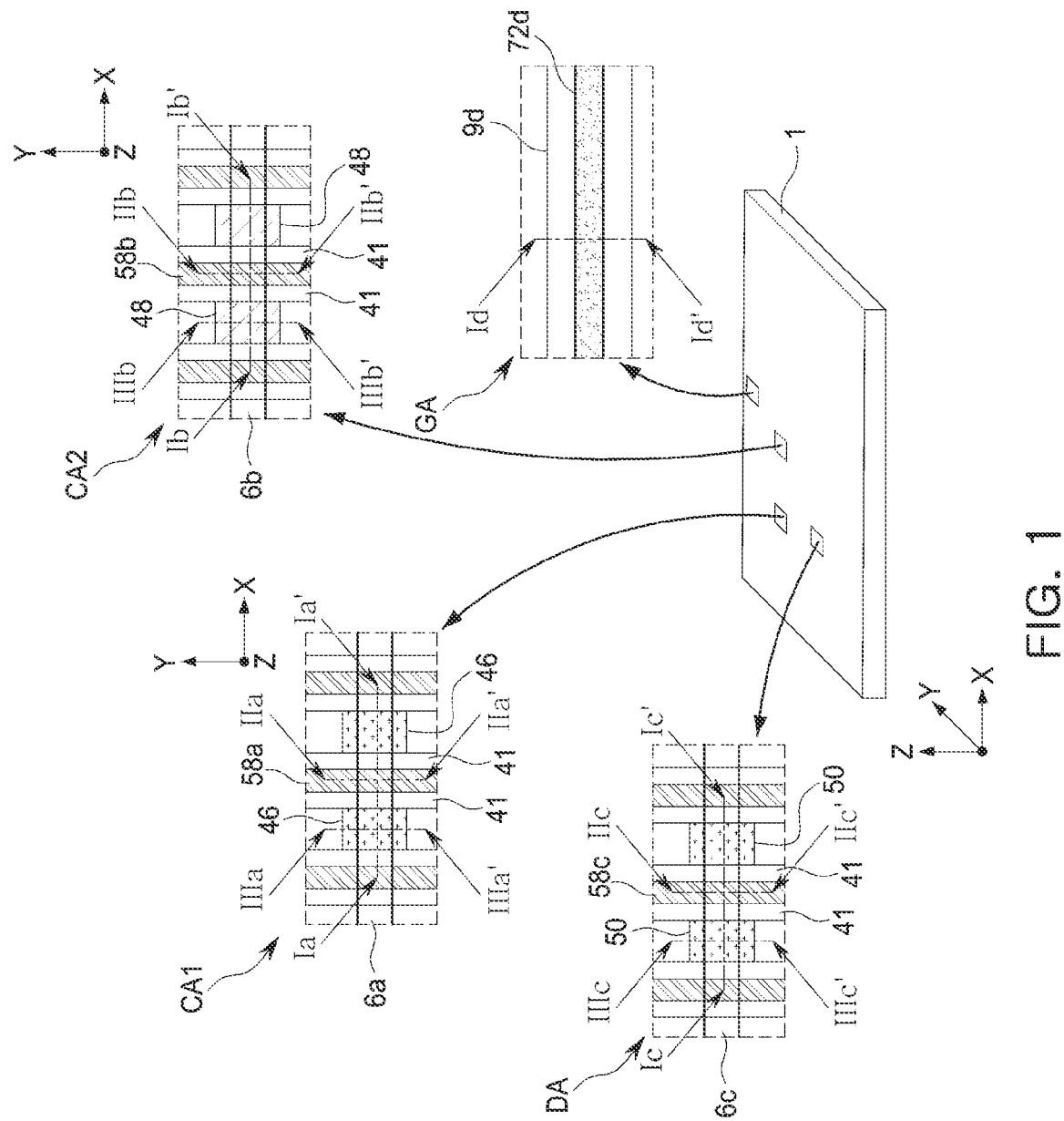
FIG. 1 is a partial cut-out, perspective view of a semiconductor device according to embodiments of the inventive concept.

Figure (FIG. 1 is a partial cut-out, perspective view of a semiconductor device according to embodiments of the inventive concept, and FIGS. 2A, 2B, 3A, 3B, 4, and 5 are respective cross-sectional views variously illustrating portions of the semiconductor device of FIG. 1.

Figure 2A:
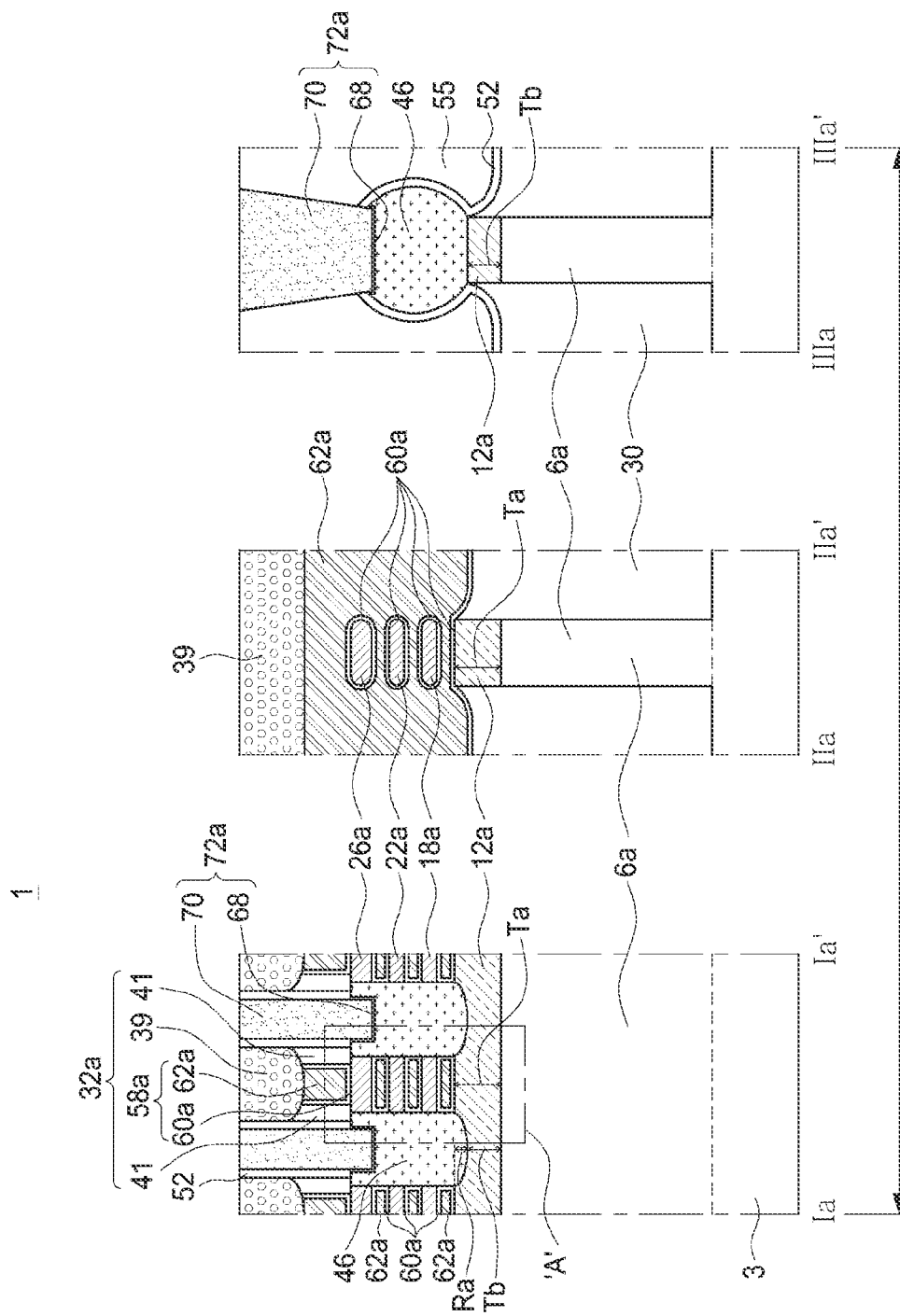
FIGS. 2A, 2B, 3A, 3B, 4 and 5 are respective cross-sectional views illustrating semiconductor devices according to embodiments of the inventive concept.
Figure 2B:
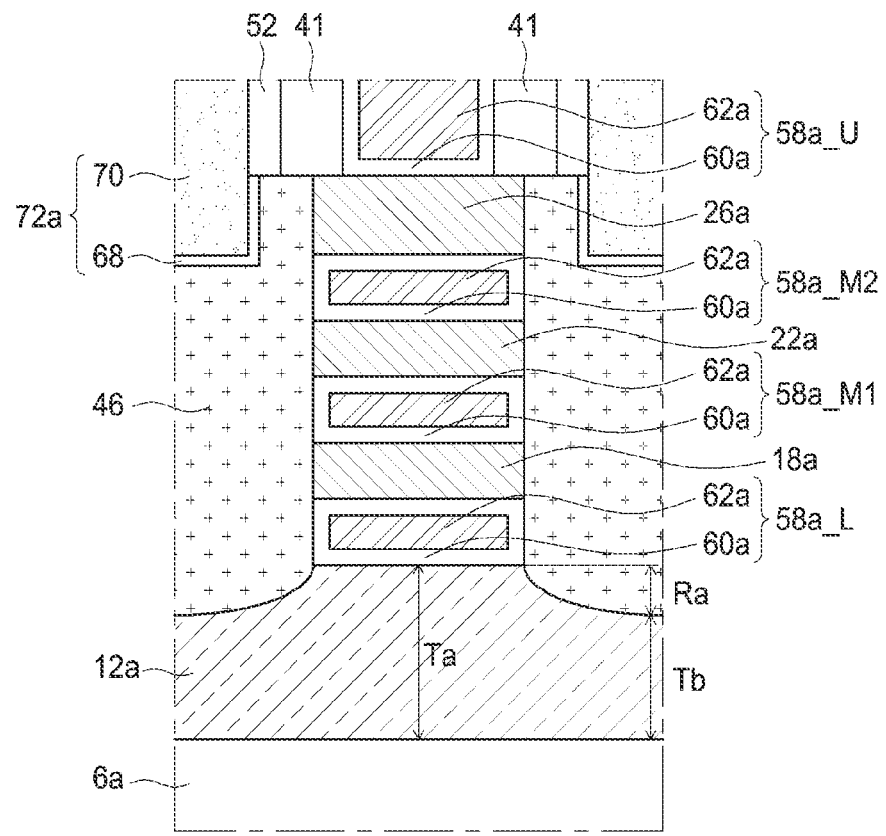
Figure 3A:
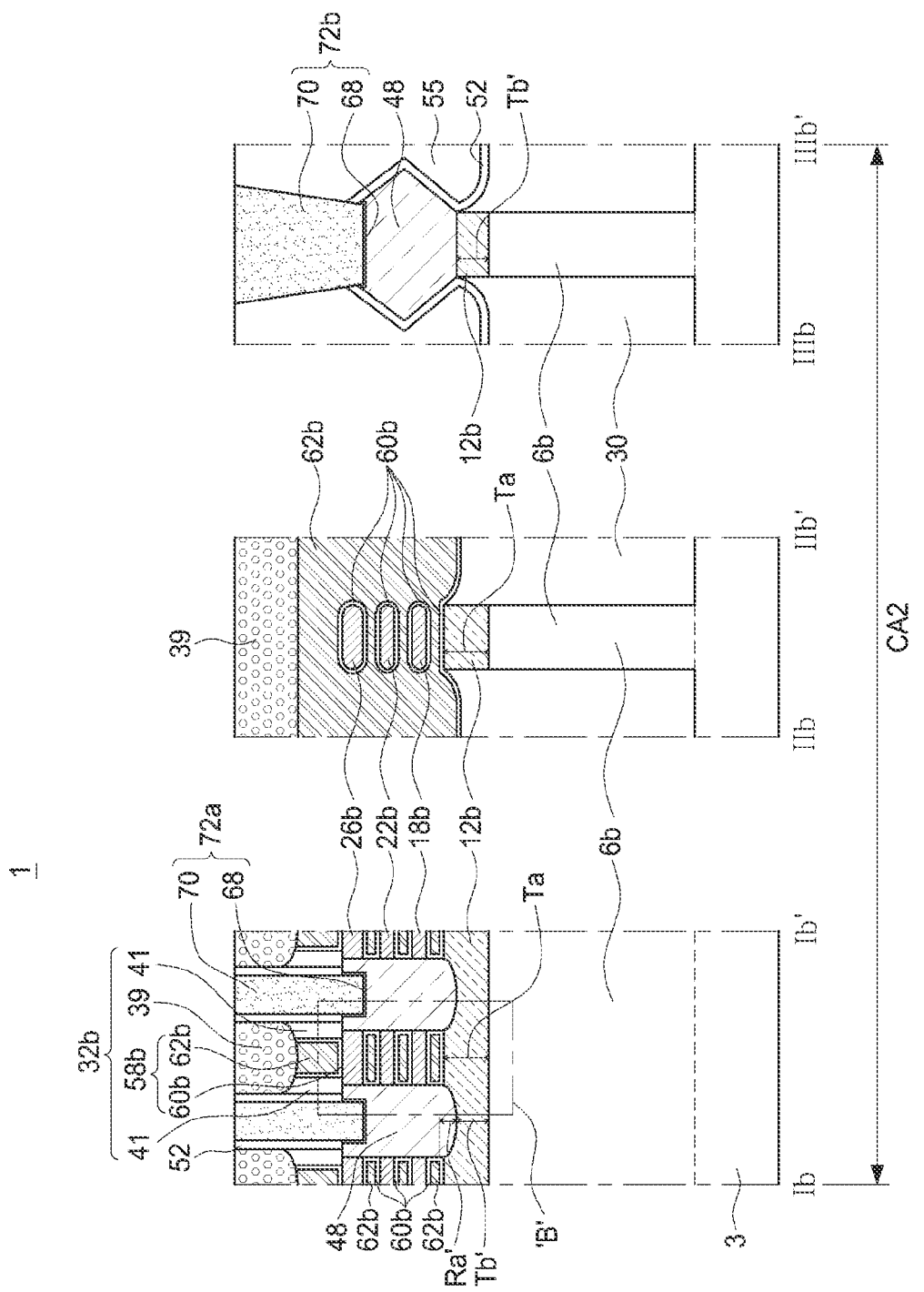
Figure 3B:
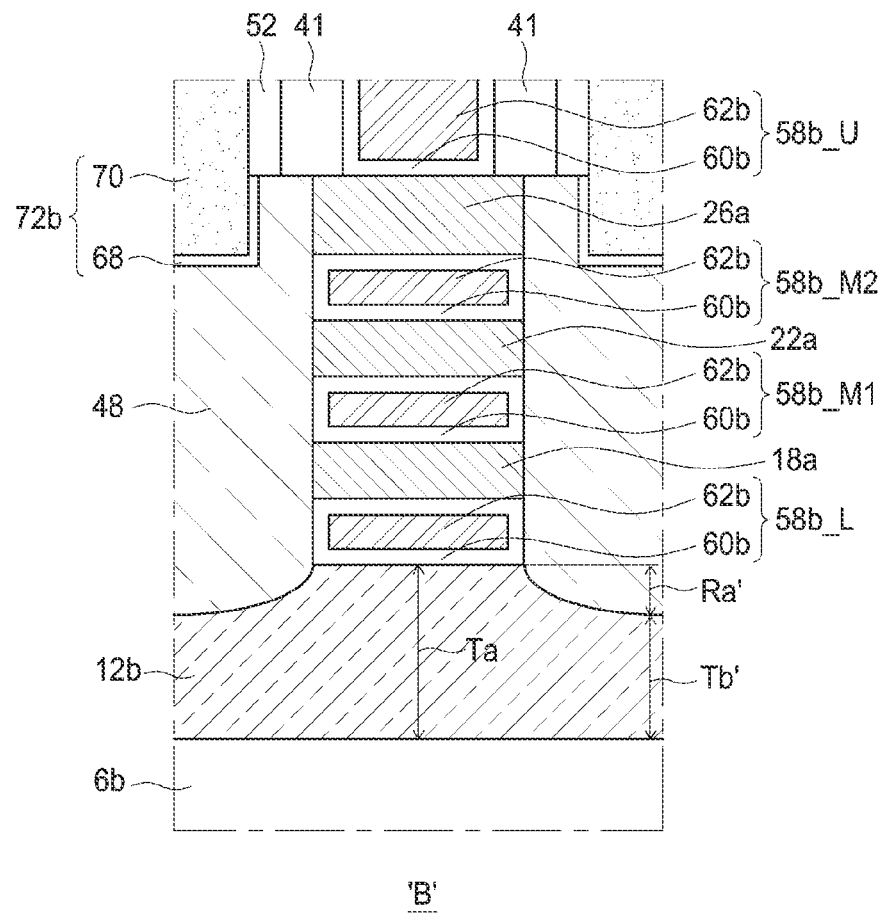
Figure 4:
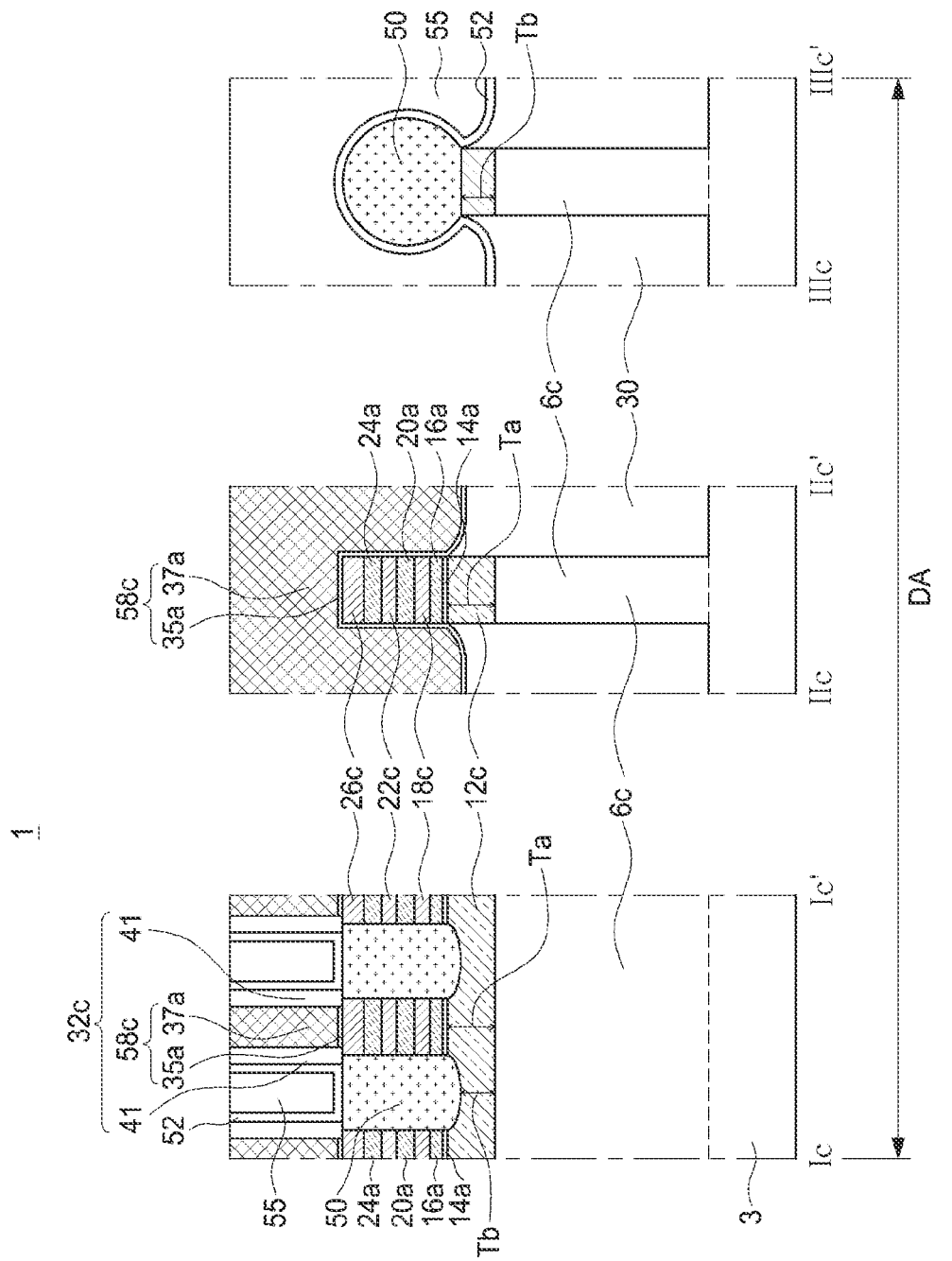
Figure 5:
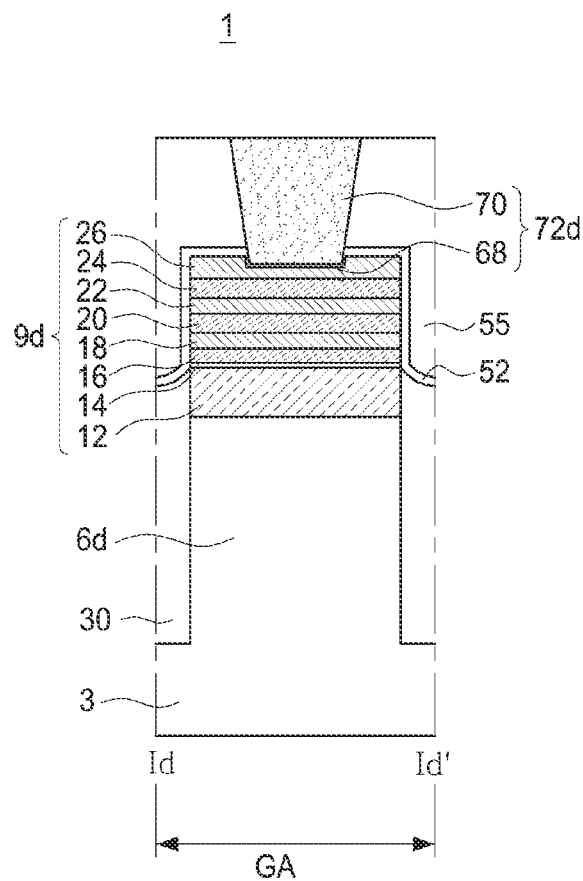

In this regard, the respective partial cut-out regions of FIG. 1 are enlarged and shown in plan (or top-down) view. FIG. 2A is a cross-sectional view variously illustrating region CA1 taken along lines Ia-Ia', IIa-IIa', and IIIa-IIIa-IIIa' of FIG. 1, FIG. 2B is an enlarged cross-sectional view of region 'A' indicated in FIG. 2A, FIG. 3A is a cross-sectional view variously illustrating region CA2 taken along lines Ib-Ib', IIb-IIb', and IIIb-IIIb' of FIG. 1, FIG. 3B is an enlarged cross-sectional view of region 'B' indicated in FIG. 3A, FIG. 4 is a cross-sectional view variously illustrating region DA taken along lines Ic-Ic', IIc-IIc', and IIIc-IIIc' of FIG. 1, and FIG. 5 is a cross-sectional view illustrating region GA taken along line Id-Id' of FIG. 1.

Referring collectively to FIGS. 1, 2A, 2B, 3A, 3B, 4 and 5, a semiconductor device 1 according to embodiments of the inventive concept may include a substrate 3, fins (e.g., fins 6a, 6b, 6c and 6d), a lower barrier layer (e.g., lower barrier layers 12a, 12b, 12c, and 12d), source/drain regions (e.g., source/drain regions 46, 48, and 50), channel layers (e.g., channel layers 18a, 22a, 26a, 18b, 22b, and 26b), semiconductor layers (e.g., semiconductor layers 16, 20, 24, 18, 22, 26, 16a, 20a, 24a, 18c, 22c and 26c), and gate structures (e.g., gate structures 32a, 32b, and 32c).

The semiconductor device 1 may further include one or more of upper barrier layers (e.g., upper barrier layers 14a and 14), an isolation layer (e.g., isolation layer 30), and contact plugs (e.g., contact plugs 72a and 72b).

As illustrated in FIG. 1, the substrate 3 may be understood as including first type regions (e.g., a first circuit region CA1, a second circuit region CA2) and second type regions (e.g., a dummy region DA, and a guard ring region GA). In this context, the term "circuit region" denotes a region in which active element(s) (e.g., transistors) are disposed, the term "dummy region" denotes a region in which active element(s) are not disposed, and the term "guard ring region" denotes a region disposed proximate to an edge portion of the semiconductor device in order to prevent moisture from permeating into the semiconductor device 1 and/or peripheral cracking of the semiconductor device 1 under mechanical stress induced by a sawing process applied to a scribe line used to singulate the semiconductor device 1.

In some embodiments, the substrate 3 may be a semiconductor substrate (e.g., a single-crystalline silicon substrate).

The fins (e.g., fins 6a, 6b, 6c, and 6d) may extend (or protrude) from the substrate 3 in a vertical (or Z) direction substantially perpendicular to an upper surface of the substrate 3. The fins may be referred to as active fins or semiconductor fins.

As shown in FIGS. 2A, 2B, 3A, 3B, 4 and 5 the various fins 6a, 6b, 6c, and 6d may include first fins (e.g., first fins 6a and 6b) respectively disposed in the first circuit regions CA1 and CA2, and second fins (e.g., second fins 6c and 6d) respectively disposed in the dummy region DA and the guard ring GA.

Among the first fins, a first fin disposed in the first circuit region CA1 may be referred to as a first circuit fin 6a, while a first fin disposed in the second circuit region CA2 may be referred to as a second circuit fin 6b.

Each of the first circuit fin 6a and the second circuit fin 6b, respectively protruding from the substrate 3 in the vertical (Z) direction, may have a bar or a line shape extending in a first horizontal (or X) direction parallel to the upper surface of the substrate 3.

The first circuit fin 6a may have a first conductivity type (e.g., a P-type conductivity), while the second circuit fin 6b may have a second conductivity type different from the first conductivity type (e.g., an N-type conductivity). Alternately, in some other embodiments of the inventive concept, the definition of the first and second conductivity types may be reversed with respect to P-type and N-type.

Among the second fins, a second fin 6c disposed in the dummy region DA may be referred to as a dummy fin 6c, and a second fin 6d disposed in the guard ring region GA may be referred to as a guard fin 6d.

The isolation layer 30 may be disposed on respective side surfaces of the fins 6a, 6b, 6c, and 6d on the substrate 3. Here, the isolation layer 30 may contact at least part of the side surfaces of the fins 6a, 6b, 6c, and 6d. In some embodiment, the isolation layer 30 may include an insulating material, such as silicon oxide.

The lower barrier layers 12a, 12b, 12c and 12d may be formed from an epitaxially-grown material extending in the vertical (Z) direction from the fins 6a, 6b, 6c, and 6d. The lower barrier layers 12a, 12b, 12c, and 12d include first lower barrier layers 12a and 12b contacting the first fins 6a and 6d, and second lower barrier layers 12c and 12d contacting the second fins 6c and 6d.

The first lower barrier layers 12a and 12b may include a first circuit lower barrier layer 12a on the first circuit fin 6a, and a second circuit lower barrier layer 12b on the second circuit fin 6b. The second lower barrier layers 12c and 12d may include a dummy lower barrier layer 12c on the dummy fin 6c, and a lower guard barrier layer 12d on the guard fin 6d.

Source/drain regions 46, 48, and 50 may include first source/drain regions 46, spaced apart in the vertical (Z) direction on the first circuit lower barrier layer 12a, and second source/drain regions 48 spaced apart from in the vertical (Z) direction on the second circuit lower barrier layer 12b. The first source/drain regions 46 may include epitaxial layer(s) formed using an epitaxial growth process. The second source/drain regions 48 may include epitaxial layer(s) formed using an epitaxial growth process. When the first circuit fin 6a is P-type, the first source/drain regions 46 may be N-type. When the second circuit fin 6b is N-type, the second source/drain regions 48 may be P-type.

The source/drain regions 46, 48 and 50 may further include dummy source/drain regions 50 spaced apart on the dummy lower barrier layer 12c. The dummy source/drain regions 50 may be formed simultaneously with one of the first and second source/drain regions 46 and 48, and may have the same conductivity type.

The channel layers 18a, 22a, 26a, 18b, 22b, and 26b may include first channel layers 18a, 22a and 26a, spaced apart on the first circuit lower barrier layer 12a in the vertical (Z) direction, and second channel layers 18b, 22b, and 26b spaced apart and stacked on the second circuit lower barrier layer 12b in the vertical (Z) direction.

The first channel layers 18a, 22a, and 26a may be disposed between the first source/drain regions 46. The first channel layers 18a, 22a, and 26a may be in contact with the first source/drain regions 46 and may be formed of an undoped silicon material. The second channel layers 18b, 22b, and 26b may be in contact with the second source/drain regions 48 and may be formed of an undoped silicon material. Among the first channel layers 18a, 22a, and 26a, an uppermost first channel layer 26a may have a thickness (e.g., a dimension measured in the vertical (Z) direction) greater than a thickness of each of the remaining first channel layers 18a and 22a. Among the second channel layers 18b, 22b, and 26b, an uppermost second channel layer 26b may have a thickness greater than a thickness of each of the remaining second channel layers 18b and 22b.

A thickness of the first lower barrier layer 12a may be greater than a thickness of a lowermost first channel layer 18a, among the first channel layers 18a, 22a, and 26a.

A thickness of the first lower barrier layer 12a may be greater than a thickness of the uppermost first channel layer 26a, among the first channel layers 18a, 22a, and 26a.

The upper barrier layers 14a and 14 may be formed of a material epitaxially grown from the second lower barrier layers 12c and 12d. The upper barrier layers 14a and 14 may include a dummy upper barrier layer 14a on the dummy lower barrier layer 12c and an upper guard barrier layer 14 on the lower guard barrier layer 12d.

The semiconductor layers 16, 20, 24, 18, 22, 26, 16a, 20a, 24a, 18c, 22c, and 26c may include first dummy semiconductor layers 16a, 20a, and 24a and second dummy semiconductor layers 18c, 22c, and 26c alternately and repeatedly stacked on the dummy lower barrier layer 12c in the vertical (Z) direction, and may include first guard semiconductor layers 16, 20, and 24 and second guard semiconductor layers 18, 22, and 26 alternately and repeatedly stacked on the guide lower barrier layer 12d in the vertical (Z) direction.

The first dummy semiconductor layers 16a, 20a, and 24a and the first guard semiconductor layers 16, 20, and 24 may be formed of the same material. The first dummy semiconductor layers 16a, 20a, and 24a and the first guard semiconductor layers 16, 20, and 24 may have the same thickness on the same height level. Among the first dummy semiconductor layers 16a, 20a, and 24a, a lowermost first dummy semiconductor layer 16a may have a thickness less than a thickness of each of a first middle dummy semiconductor layer and an upper first dummy semiconductor layer 24a, among the first dummy semiconductor layers 16a, 20a, and 24a. Among the first guard semiconductor layers 16, 20 and 24, a lowermost first guard semiconductor layer 16 may have a thickness less than a thickness of each of a middle first guard semiconductor layer 20 and an upper first guard semiconductor layer 24, among the first guard semiconductor layers 16, 20, and 24.

The thickness of the lowermost first dummy semiconductor layer 16a, among the first dummy semiconductor layers 16a, 20a, and 24a, may be greater than the thickness of the first upper barrier layer 14a.

The sum of the thickness of the lowermost first dummy semiconductor layer 16a, among the first dummy semiconductor layers 16a, 20a and 24a, and the thickness of the first upper barrier layer 14a may be substantially the same as the thickness of the first middle dummy semiconductor layer 20a, among the first dummy semiconductor layers 16a, 20a, and 24a.

The sum of the thickness of the lowermost first dummy semiconductor layer 16a, among the first dummy semiconductor layers 16a, 20a, and 24a, and the thickness of the first upper barrier layer 14a may be less than the thickness of the dummy lower barrier layer 12c.

The sum of the thickness of the lowermost first dummy semiconductor layer 16a, among the first dummy semiconductor layers 16a, 20a, and 24a, and the thickness of the first upper barrier layer 14a may the less than the thickness of the uppermost second dummy semiconductor layers 26c, among the second dummy semiconductor layers 18c, 22c, and 26c.

The second dummy semiconductor layers 18c, 22c, and 26c and the second guard semiconductor layers 18, 22, and 26 may be formed of the same material. The second dummy semiconductor layers 18c, 22c, and 26c and the second guard semiconductor layers 18, 22, and 26 may have the same thickness on the same height level. Among the second dummy semiconductor layers 18c, 22c, and 26c, an uppermost second dummy semiconductor layer 26c may have a thickness greater than a thickness of each of the remaining second dummy semiconductor layers 18c and 22c. Among the second guard semiconductor layers 18, 22, and 26, an uppermost second guard semiconductor layer 26 may have a thickness greater than a thickness of each of the remaining second guard semiconductor layers 18 and 22.

In some embodiments, in the guard ring region GA, the lower guard barrier layer 12, the upper guard barrier layer 14, the first guard semiconductor layers 16, 20, and 24, and the second guard semiconductor layers 18, 22, and 26 may constitute a guard ring semiconductor structure 9d.

The gate structures 32a, 32b, and 32c may include a first gate structure 32a, a second gate structure 32b, and a dummy gate structure 32c.

The first gate structure 32a may include a portion intersecting the first circuit fin 6a and extending in a second horizontal (or Y) direction perpendicular to the first horizontal (X) direction, to overlap the isolation layer 30. The second gate structure 32b may a portion intersecting the second circuit fin 6b and extending in the second horizontal (Y) direction to overlap the isolation layer 30. The dummy gate structure 32c may include a portion intersecting the dummy fin 6c and extending in the second horizontal (Y) direction to overlap the isolation layer 30.

Each of the first and second gate structures 32a and 32b may include a gate, a gate spacer 41 on a side surface of the gate, and a gate capping pattern 39 on the gate and the gate spacer 41. The gate spacer 41 may include an insulating material including at least one of SiO, SiN, SiCN, SiOC, SiON, or SiOCN, and the gate capping pattern 39 may include an insulating material such as SiN.

The dummy gate structure 32c may include a dummy gate 58c and a gate spacer 41 on a side surface of the dummy gate 58c. The dummy gate 58c may include a dummy gate dielectric layer 35a and a dummy gate electrode 37a on the dummy gate dielectric layer 35a.

The gate of the first gate structure 32a may be referred to as a first gate 58a, and the gate of the second gate structure 32b may be referred to as a second gate 58a.

The first gate 58a may surround an upper surface, a lower surface, and a side surface of each of the first channel layers 18a, 22a, and 26a and may extend in the second horizontal (Y) direction. The second gate 58b may surround an upper surface, a lower surface, and a side surface of each of the second channel layers 18b, 22b, and 26b and may extend in the second horizontal (Y) direction. The first gate 58a may include a first gate dielectric layer 60a and a first gate electrode 62a. The first gate dielectric layer 60a may include a portion interposed between the first gate electrode 62a and each of the first channel layers 18a, 22a, and 26a, a portion covering a lower surface of the first gate electrode 62a, and a portion covering the side surface of the first gate electrode 62a.

As illustrated in FIG. 2B, the first gate 58a may include a lower gate portion 58a_L interposed between the first lower barrier layer 12a and a lowermost first channel layer 18a, among the first channel layers 18a, 22a, and 26a, a first middle gate portion 58a_M1, interposed between the lowermost first channel layer 18a and the middle channel layer 22a, among the first channel layers 18a, 22a, and 26a, a second middle gate portion 58aM2 interposed between the middle channel layer 26a and an uppermost first channel layer 26a, among the first channel layers 18a, 22a, and 26a, and an upper gate portion 58a_U disposed on the uppermost first channel layer 26a.

The second gate 58b may include a second gate dielectric layer 60b and a second gate electrode 62b. The second gate dielectric layer 60b may include a portion interposed between the second gate electrode 62b and each of the second channel layers 18b, 22b, and 26b, a portion covering a lower surface of the second gate electrode 62b, and a portion covering a side surface of the second gate electrode 62b.

As illustrated in FIG. 3B, the second gate 58b may include a lower gate portion 58b_L interposed between the second lower barrier layer 12b and a lowermost second channel layer 18b, among the second lower barrier layers 18b, 22b, and 26b, a first middle gate portion 58b_M1 interposed between the lowermost second channel layer 18b and a middle channel layer 22b, among the second channel layers 18b, 22b, and 26b, a second middle gate portion 58bM2 interposed between the middle channel layer 22b and an uppermost second channel layer 26b, among the second channel layers 18b, 22b, and 26b, and an upper gate portion 58b_U disposed on the uppermost second channel layer 26b.

The semiconductor device 1 may further include an insulating liner 52 and an interlayer insulating layer 55 on the insulating liner 52.

The insulating liner 52 may cover an upper surface of the isolation layer 30 which does not overlap the gate structures 32a, 32b, and 32c, and may extend upwardly of the source/drain regions 46, 48, and 50 and upwardly of side surfaces of the gate structures 32a, 32b, and 32c. The interlayer insulating layer 55 may be disposed on the insulating liner 52.

The contact plugs 72a and 72b may include first contact plugs 72a, penetrating through the interlayer insulating layer 55 and the insulating liner 52 and contacting the first source/drain regions 46, and second contact plugs 72b penetrating through the interlayer insulating layer 55 and the insulating liner 52 and contacting the second source/drain regions 48.

Each of the first and second contact plugs 72a and 72b may include a metal-semiconductor compound layer 68 and a plug conductive layer 70 on the metal-semiconductor compound layer 68.

The metal-semiconductor compound layers 68 of the first contact plugs 72a may be in contact with the first source/drain regions 46. The metal-semiconductor compound layers 68 of the second contact plugs 72b may be in contact with the second source/drain regions 48.

The semiconductor device 1 may further include a guard pattern 72d. The guard pattern 72d may be formed simultaneously with the first and second contact plugs 72a and 72b. For example, the guard pattern 72d may include the metal-semiconductor compound layer 68 and the plug conductive layer 70 on the metal-semiconductor compound layer 68. The metal-semiconductor compound layer 68 of the guard pattern 72d may be in contact with the guard ring semiconductor structure 9d.

In some embodiments, the substrate 3 and the fins 6a, 6b, 6c, and 6d may be formed of a single-crystalline silicon material.

The lower barrier layers 12a, 12b, 12c, and 12d may include a first material. The first material may be a silicon-carbon (SiC) material. The lower barrier layers 12a, 12b, 12c, and 12d may be formed of SiC by an epitaxial growth process. In each of the lower barrier layers 12a, 12b, 12c, and 12d, at least a portion may be formed of undoped SiC.

In the SiC material of the lower barrier layers 12a, 12b, 12c, and 12d, a concentration of carbon (C) may be within a range of about 0.01 atomic % to about 50 atomic %.

A maximum thickness Ta of each of the lower barrier layers 12a, 12b, 12c, and 12d may be within a range of about 1 nm to about 50 nm.

The first circuit lower barrier layer 12a may have a lower surface and an upper surface opposing the lower surface. The lower surface of the first circuit lower barrier layer 12a may be in contact with the first fin 6a and may be substantially planar. The upper surface of the first circuit lower barrier layer 12a may have an undulating (or wavy) shape. The upper surface of the first circuit lower barrier layer 12a may contact a lower surface of the first source/drain regions 46 and a lower surface of the lower gate portion 58a_L. The upper surface of the first circuit lower barrier layer 12a may have a first portion, overlapping the lower gate portion 58a_L, and second portions overlapping the first source/drain regions 46 and recessed as compared with the first portion. The first circuit lower barrier layer 12a may have a maximum thickness Ta in a portion overlapping the lower gate portion 58a_L, and may have a minimum thickness Tb in regions overlapping the first source/drain regions 46.

A thickness of the first circuit lower barrier layer 12a may be greater than a thickness of at least one of the first channel layers 18a, 22a, and 26a.

In the first circuit lower barrier layer 12a, a maximum thickness Ta in a region overlapping the first gate structure 32a may be greater than a minimum thickness Tb in a region overlapping the first source/drain regions 46.

The first source/drain regions 46 may extend inwardly of the first circuit lower barrier layer 12a by a first depth (e.g., a dimension measured in the vertical (Z) direction) Ra.

The maximum thickness Ta may be greater than a thickness of at least one of the first channel layers 18a, 22a, and 26a.

The maximum thickness Ta may be equal to a thickness of the uppermost first channel layer 26a, among the first channel layers 18a, 22a, and 26a, or may be greater than the thickness of the uppermost first channel layer 26a.

The maximum thickness Ta may be greater than a thickness of the lower gate portion 58a_L.

The first depth Ra may be less than a thickness of each of the first channel layers 18a, 22a, and 26a.

The first depth Ra may be less than the thickness of the lower gate portion 58a_L.

The minimum thickness Tb may be greater than the first depth Ra.

The minimum thickness Tb may be greater than a thickness of at least one of the first channel layers 18a, 22a, and 26a. The minimum thickness Tb may be greater than each of the lowermost first channel layer 18a and the middle first channel layer 22a, among the first channel layers 18a, 22a, and 26a.

The minimum thickness Tb may be greater than the thickness of the uppermost first channel layer 26a, among the first channel layers 18a, 22a, and 26a.

The minimum thickness Tb may be greater than the thickness of the lower gate portion 58a_L.

The upper barrier layers 14a and 14 may include a second material different from the first material. The second material may be a silicon-germanium-carbon (SiGeC) material. For example, the upper barrier layers 14a and 14 may be formed of a SiGeC material by an epitaxial growth process. The upper barrier layers 14a and 14 may be formed of an undoped SiGeC material.

In the SiGeC material of the upper barrier layers 14a and 14, a concentration of carbon (C) may be in a range of about 0.01 atomic % to about 50 atomic %, and a concentration of germanium (Ge) may be in a range of about 5 atomic % to about 95 atomic %.

A thickness of each of the upper barrier layers 14a and 14 may be within a range of about 0.1 nm to about 5 nm.

The channel layers 18a, 22a, 26a, 18b, 22b, and 26b may include a third material different from the first material and the second material. The third material of the channel layers 18a, 22a, 26a, 18b, 22b, and 26b may be a silicon (Si) material. For example, the channel layers 18a, 22a, 26a, 18b, 22b, and 26b may be formed of a Si material by an epitaxial growth process. For example, the channel layers 18a, 22a, 26a, 18b, 22b, and 26b may be formed of an undoped Si material.

The first dummy semiconductor layers 16a, 20a, and 24a and the first guard semiconductor layers 16, 20, and 24 may include the same fourth material.

The fourth material of the first dummy semiconductor layers 16a, 20a, 24a and the first guard semiconductor layers 16, 20, and 24 may be different from the first material, the second material, and the third material. For example, the fourth material of the first dummy semiconductor layers 16a, 20a, and 24a and the first guard semiconductor layers 16, 20 and 24 may be a silicon-germanium (SiGe) material. For example, the first dummy semiconductor layers 16a, 20a, and 24a and the first guard semiconductor layers 16, 20, and 24 may be formed of a SiGe material by an epitaxial growth process. The first dummy semiconductor layers 16a, 20a, and 24a and the first guard semiconductor layers 16, 20, and 24 may be formed of an undoped SiGe material.

The second dummy semiconductor layers 18c, 22c, 26c and the second guard semiconductor layers 18, 22, 26 may be formed of the same material as the channel layers 18a, 22a, 26a, 18b, 22b, 26b.

In the first circuit region CA1, the first circuit lower barrier layer 12a may prevent or significantly reduce a leakage current, generated between the first source/drain regions 46 and the first fin 6a, during an operation of a first transistor including the first gate 58a, the first channel layers 18a, 22a, and 26a, and the first source/drain regions 46. In the second circuit region CA2, the second circuit lower barrier layer 12b may prevent or significantly reduce a leakage current, generated between the second source/drain regions 48 and the second fin 6b, during an operation of a second transistor including the second channel layers 18b, 22b, and 26b and the second source/drain regions 48. Accordingly, the first and second circuit lower barrier layers 12a and 12b may improve the overall performance of the semiconductor device 1.

Next, various modified examples of the foregoing semiconductor device 1 according to various embodiments of the inventive concept will be described. Hereinafter, in the descriptions of various modified examples of the semiconductor device 1, only materially different element(s), component(s), material layer(s) and/or features will be emphasized.

Figure 6A:
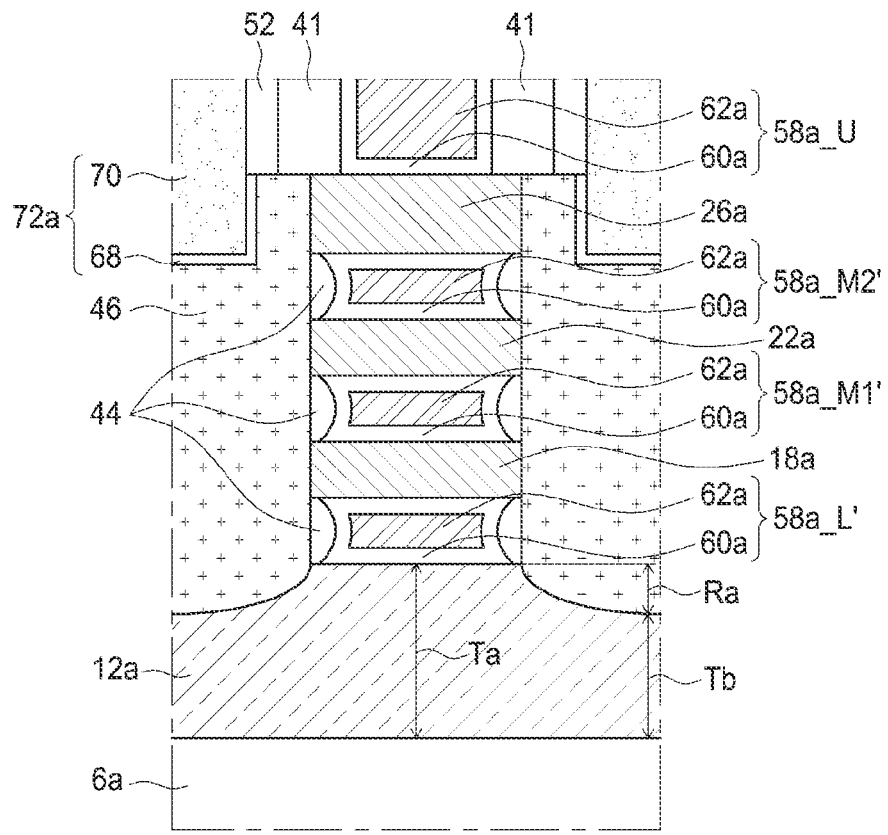
FIGS. 6A, 6B and 7 are respective, partial, enlarged cross-sectional views illustrating semiconductor devices according to embodiments of the inventive concept.

FIG. 6A is a cross-sectional view illustrating a modified version of a semiconductor device according to embodiments of the inventive concept, and may be compared to the cross-sectional view of FIG. 2B.

In the modified example shown in FIG. 6A, the lower gate portion (e.g., element 58a_L of FIG. 2B) may be modified into a lower gate portion 58a_L' having a recessed side surface in relation to first channel layers 18a, 22a, and 26a. Further, the first middle gate portion (element 58a_M1 of FIG. 2B) may be modified into a first middle gate portion 58a_M1' having a recessed side surface in relation to first channel layers 18a, 22a, and 26a, and second middle gate portion (element 58a_M2 of FIG. 2B) may be modified into a second middle gate portion 58a_M2' having a recessed side surface in relation to first channel layers 18a, 22a, and 26a.

Insulating spacers 44 may be disposed between side surfaces of the lower gate portion the lower gate portion 58a_L', the first middle gate portion 58a_M1', and the second middle gate portion 58a_M2' and the first source/drain regions 46. The insulating spacers 44 may include an insulating material such as silicon oxide, silicon nitride, or silicon oxynitride.

Figure 6B:
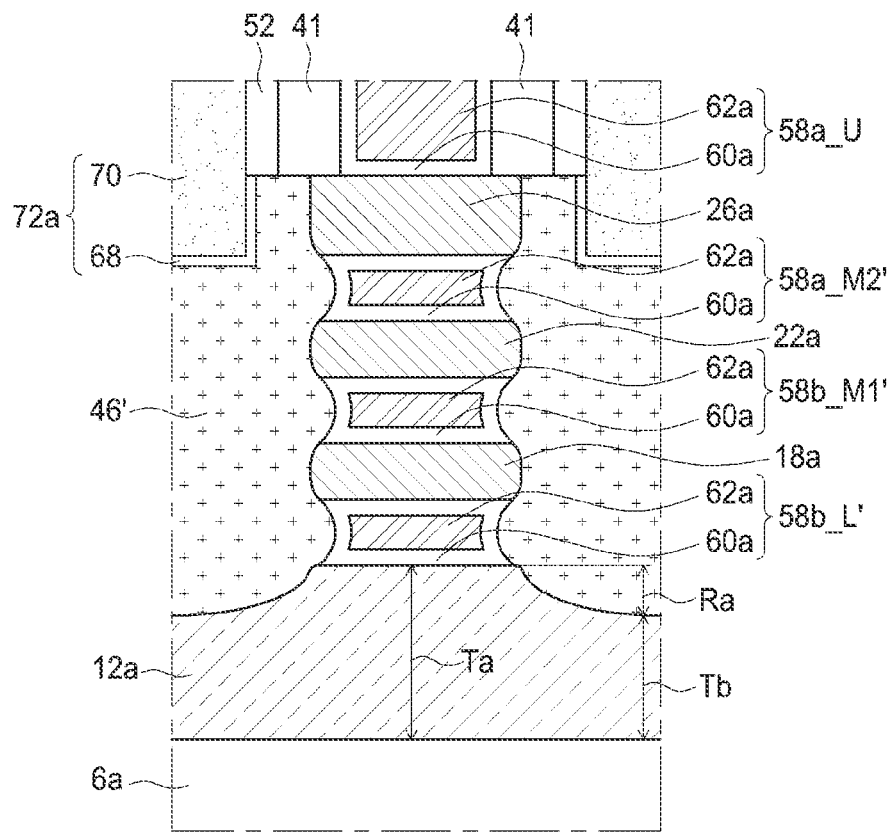

FIG. 6B is a cross-sectional view illustrating a modified example of a semiconductor device according to embodiments of the inventive concept, and may be compared with the cross-sectional view of FIG. 2B.

In a modified example of FIG. 6B, the gate portion (element 58a_L of FIG. 2B), the first middle gate portion (element 58a_M1 of FIG. 2B), and the second middle gate portion (element 58a_M2 of FIG. 2B) may be respectively modified into a lower gate portion 58a_L', a first middle gate portion 58a_M1', and a second middle gate portion 58a_M2' having recessed side surface, as described in FIG. 6A.

Further, the first source/drain regions (element 46 of FIG. 2B) may be modified into source/drain regions 46' contacting the lower gate portion 58a_L', the first middle gate portion 58a_M1', and the second middle gate portion 58a_M2', wherein side surfaces of the modified first source/drain regions 46' have a wavy shape.

Figure 7:
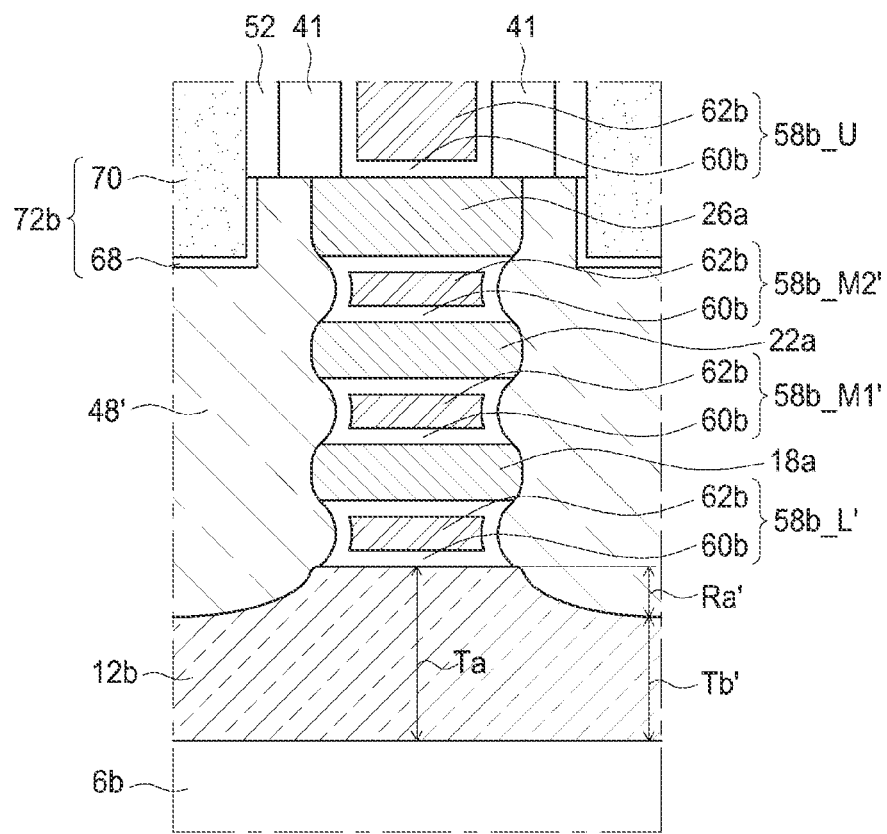

FIG. 7 is a cross-sectional view illustrating a modified example of a semiconductor device according to embodiments of the inventive concept, and may be compared with the cross-sectional view of FIG. 3B.

In a modified example of FIG. 7, the lower gate portion (element 58b_L of FIG. 3B) may be modified into a lower gate portion 58b_L' having a recessed side surface in relation to second channel layers 18b, 22b, and 26b, the first middle gate portion (element 58b_M1 of FIG. 3B) may be modified into a first middle gate portion 58b_M' having a recessed side surface in relation to second channel layers 18b, 22b, 26b, and the second middle gate portion (element 58b_M2 of FIG. 3B) may be modified into a second middle gate portion 58b_M2' having a recessed side surface in relation to second channel layers 18b, 22b, and 26b.

The second source/drain regions (element 48 of FIG. 3B) may be modified into second source/drain regions 48' contacting the lower gate portion 58b_L', the first middle gate portion 58b_M1', and the second middle gate portion 58b_M2', wherein side surfaces of the second source/drain regions 48' may have a wavy shape.

Figure 8:
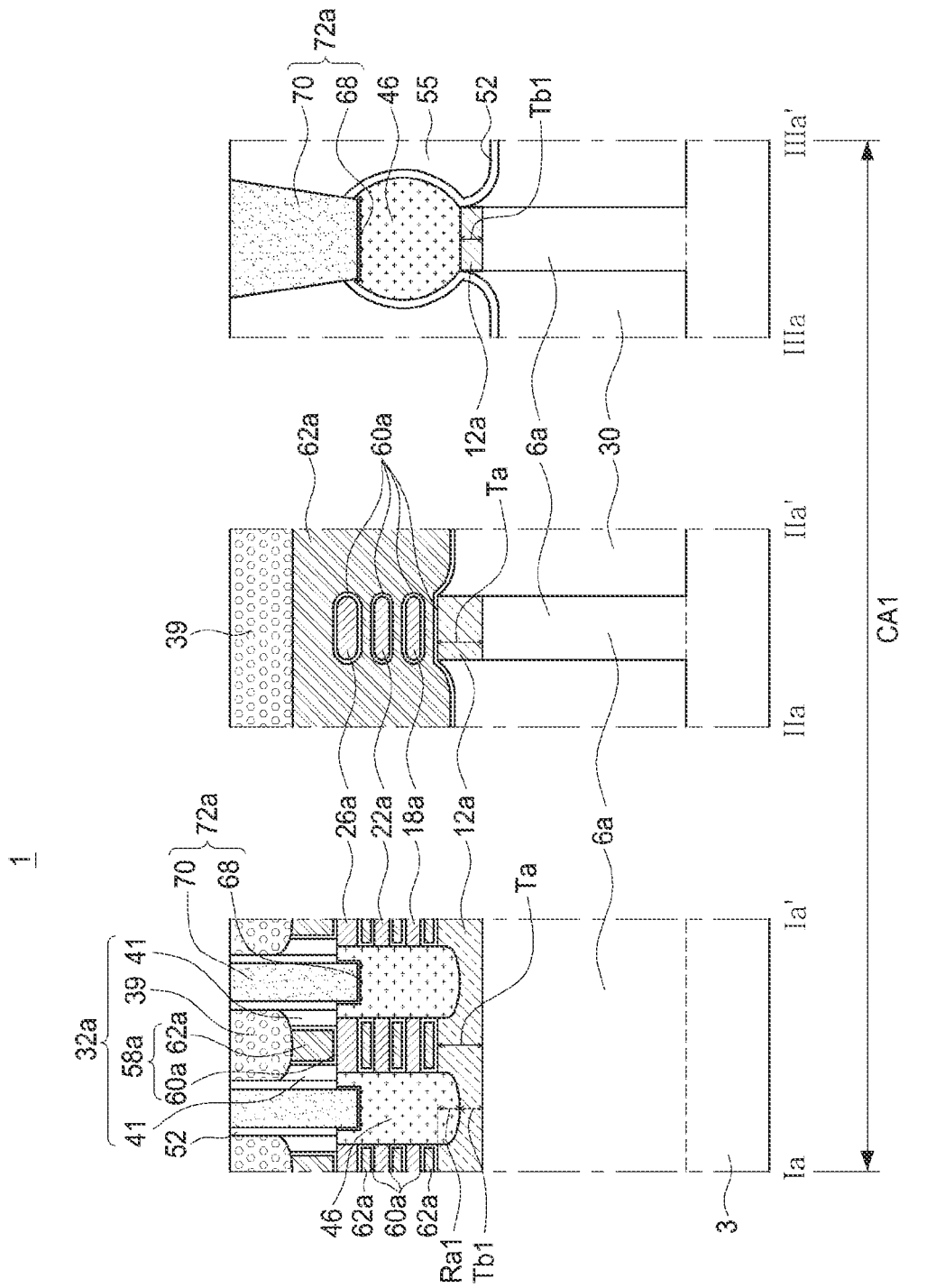
FIGS. 8, 9 10, and 11 are respective cross-sectional views illustrating modified versions of the semiconductor device of FIG. 1.

FIG. 8 is a cross-sectional view illustrating a modified version of the semiconductor device 1, and may be compared with the cross-sectional view of FIG. 2A.

In a modified example illustrated in FIG. 8, the first circuit lower barrier layer 12a may have a minimum thickness Tb1 modified in regions overlapping the source/drain regions 46. Thus, the source/drain regions 46 may have a shape extending inwardly of the first circuit lower barrier layer 12a by a modified first depth Ra1.

The minimum thickness Tb1 may be substantially the same the first depth Ra1.

The minimum thickness Tb1 (and also the first depth Ra1) may be greater than a thickness of the lower gate portion (element 58a_L of FIG. 2B).

The minimum thickness Tb1 (and also the first depth Ra1) may be greater than a thickness of at least one of the first channel layers 18a, 22a, and 26a, respectively.

Figure 9:
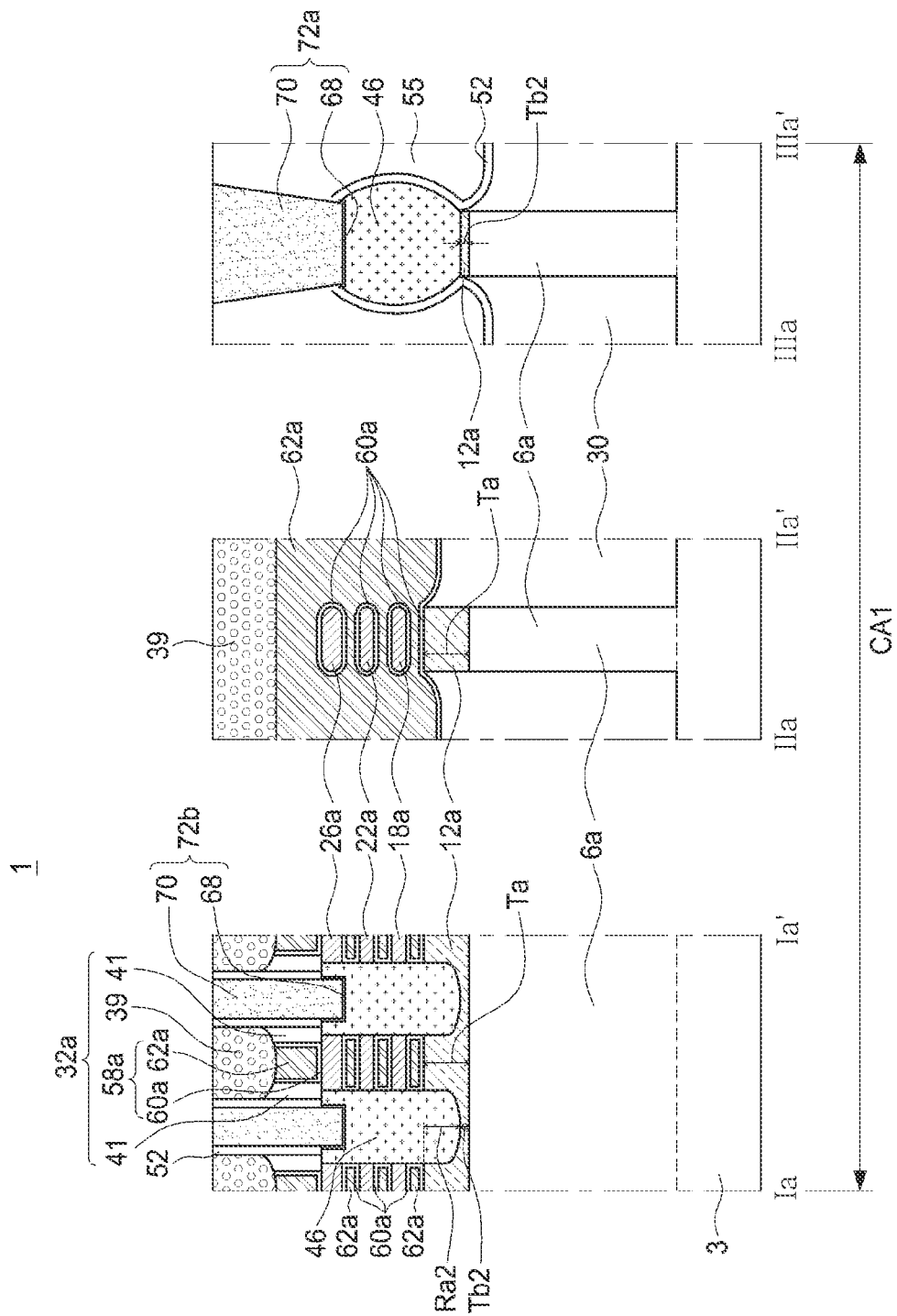

FIG. 9 is a cross-sectional view illustrating a modified version of the semiconductor device 1, and may be compared with the cross-sectional view of FIG. 2A.

In a modified example illustrated in FIG. 9, the first circuit lower barrier layer 12a may have a modified minimum thickness Tb2 in regions overlapping the first source/drain regions 46. The first source/drain regions 46 may extend inwardly of the first circuit lower barrier layer 12a by a modified first depth Ra2.

The minimum thickness Tb2 may be less than the first depth Ra2.

The first depth Ra2 may be greater than a thickness of the lower gate portion (element 58a_L of FIG. 2B).

The first depth Ra2 may be greater than a thickness of at least one of the first channel layers 18a, 22a, and 26a.

The minimum thickness Tb2 may be less than a thickness of the lower gate portion (element 58a_L of FIG. 2B).

The minimum thickness Tb2 may be less than a thickness of at least one of the first channel layers 18a, 22a, and 26a.

Figure 10:
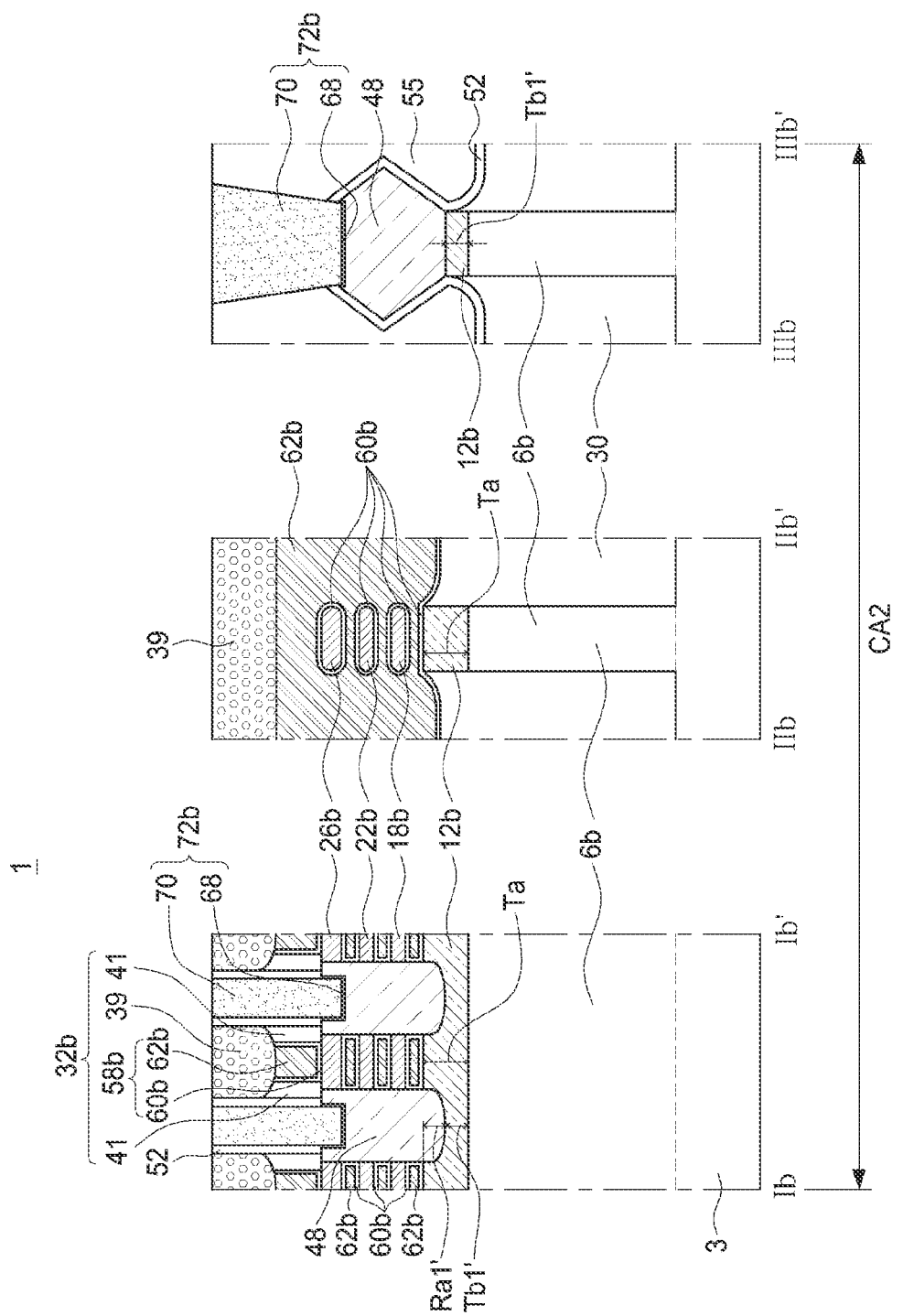

FIG. 10 is a cross-sectional view illustrating a modified version of semiconductor device 1, and may be compared with the cross-sectional view of FIG. 3A.

In a modified example illustrated in FIG. 10, the second circuit lower barrier layer 12b may have a modified minimum thickness Tb1' in regions overlapping the second source/drain regions 48. The second source/drain regions 48 may have a shape extending inwardly of the second circuit lower barrier layer 12b by a modified first depth Ra1'.

The minimum thickness Tb1' may be substantially the same as the first depth Ra1'.

The minimum thickness Tb1' and the first depth Ra1' may be greater than a thickness of the lower gate portion (element 58b_L of FIG. 3B), respectively.

The minimum thickness Tb1' and the first depth Ra1' may be greater than a thickness of at least one of the second channel layers 18b, 22b, and 26b, respectively.

Figure 11:
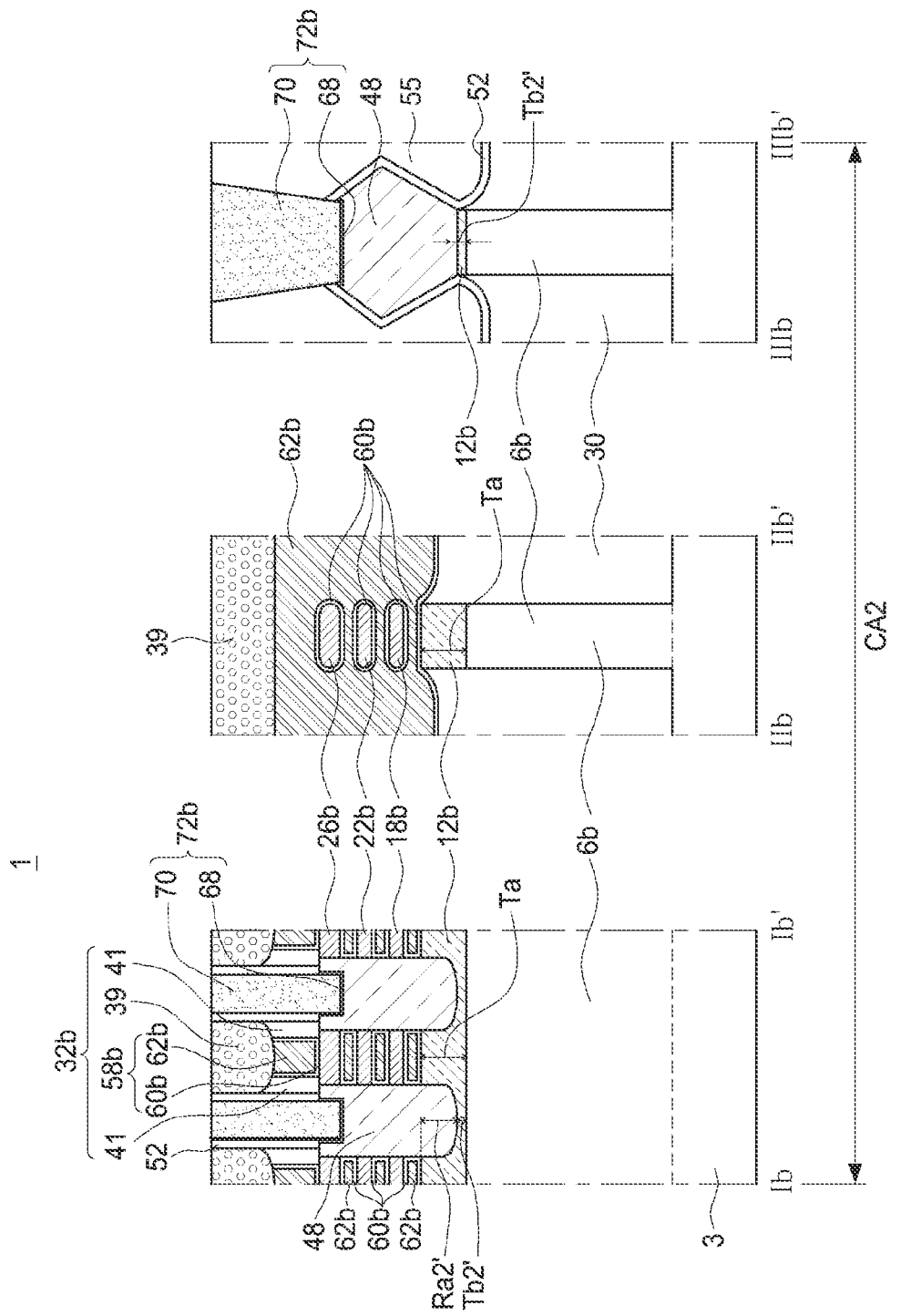

FIG. 11 is a cross-sectional view illustrating a modified version of the semiconductor device 1, and may be compared with the cross-sectional view of FIG. 3A.

In a modified example illustrated in FIG. 11, the second circuit lower barrier layer 12b may have a modified minimum thickness Tb2' in regions overlapping the second source/drain regions 48. The second source/drain regions 48 may have a shape extending inwardly of the second circuit lower barrier layer 12b by a first depth Ra2'.

The minimum thickness Tb2' may be less than the first depth Ra2'.

The first depth Ra2' may be greater than a thickness of the lower gate portion (element 58b_L of FIG. 3B).

The first depth Ra2' may be greater than a thickness of at least one of the second channel layers 18b, 22b, and 26b.

The minimum thickness Tb2' may be less than a thickness of the lower gate portion (element 58b_L of FIG. 3B).

The minimum thickness Tb2' may be less than a thickness of at least one of the second channel layers 18b, 22b, and 26b.

Figure 12A:
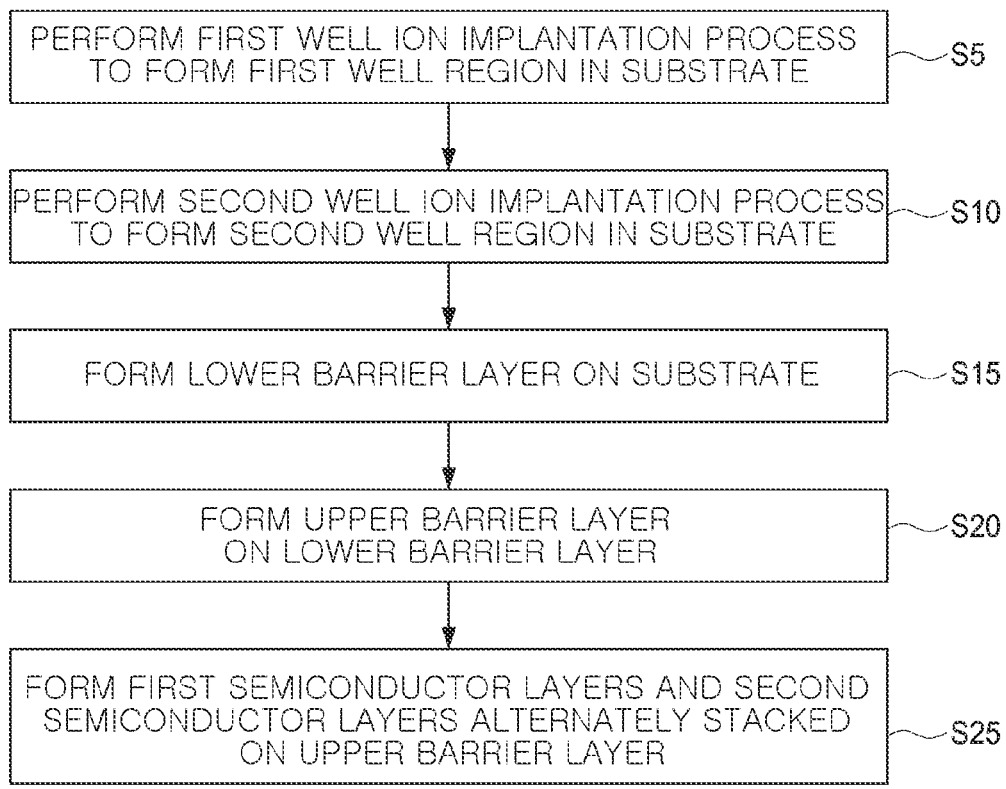
FIGS. 12A and 12B are respective flowcharts illustrating in one example a method of fabricating semiconductor devices according to embodiments of the inventive concept.
Figure 12B:
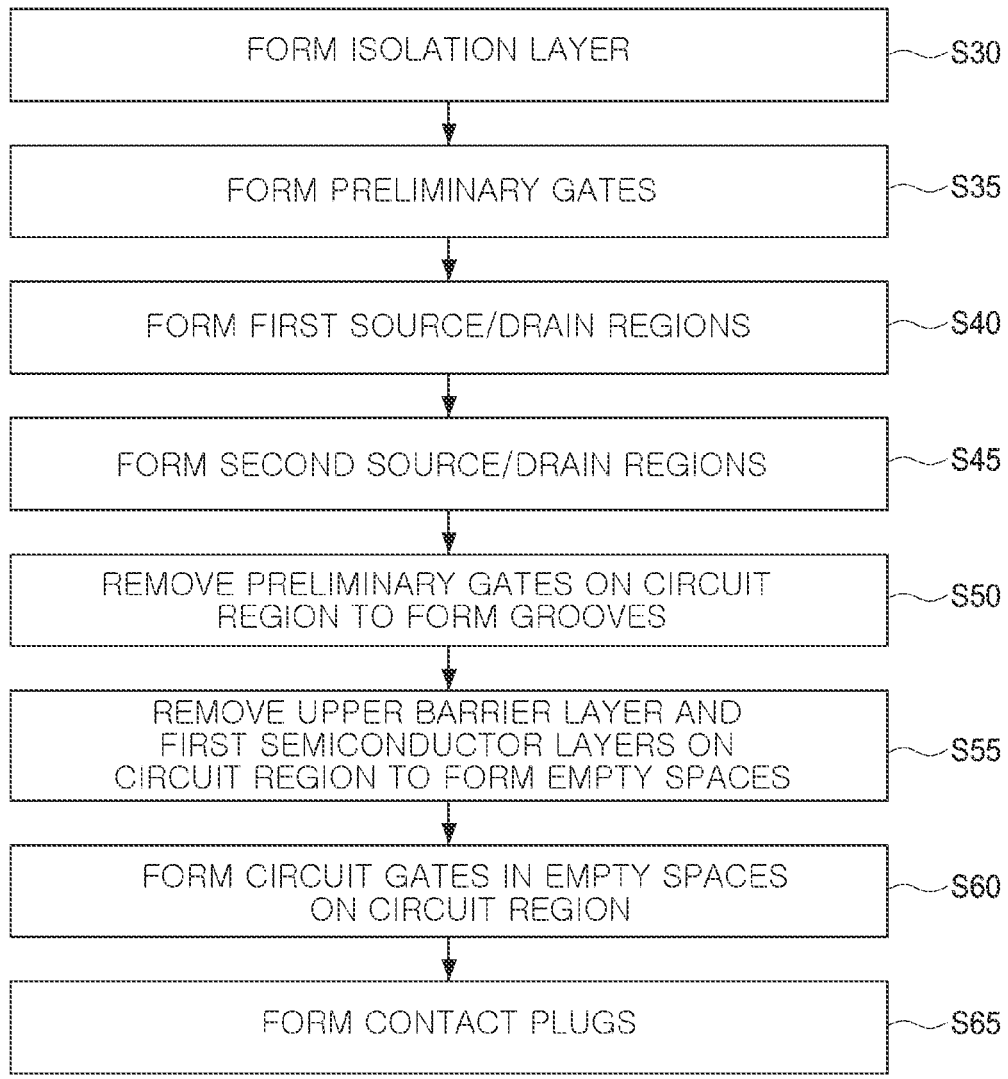
Figure 13A:
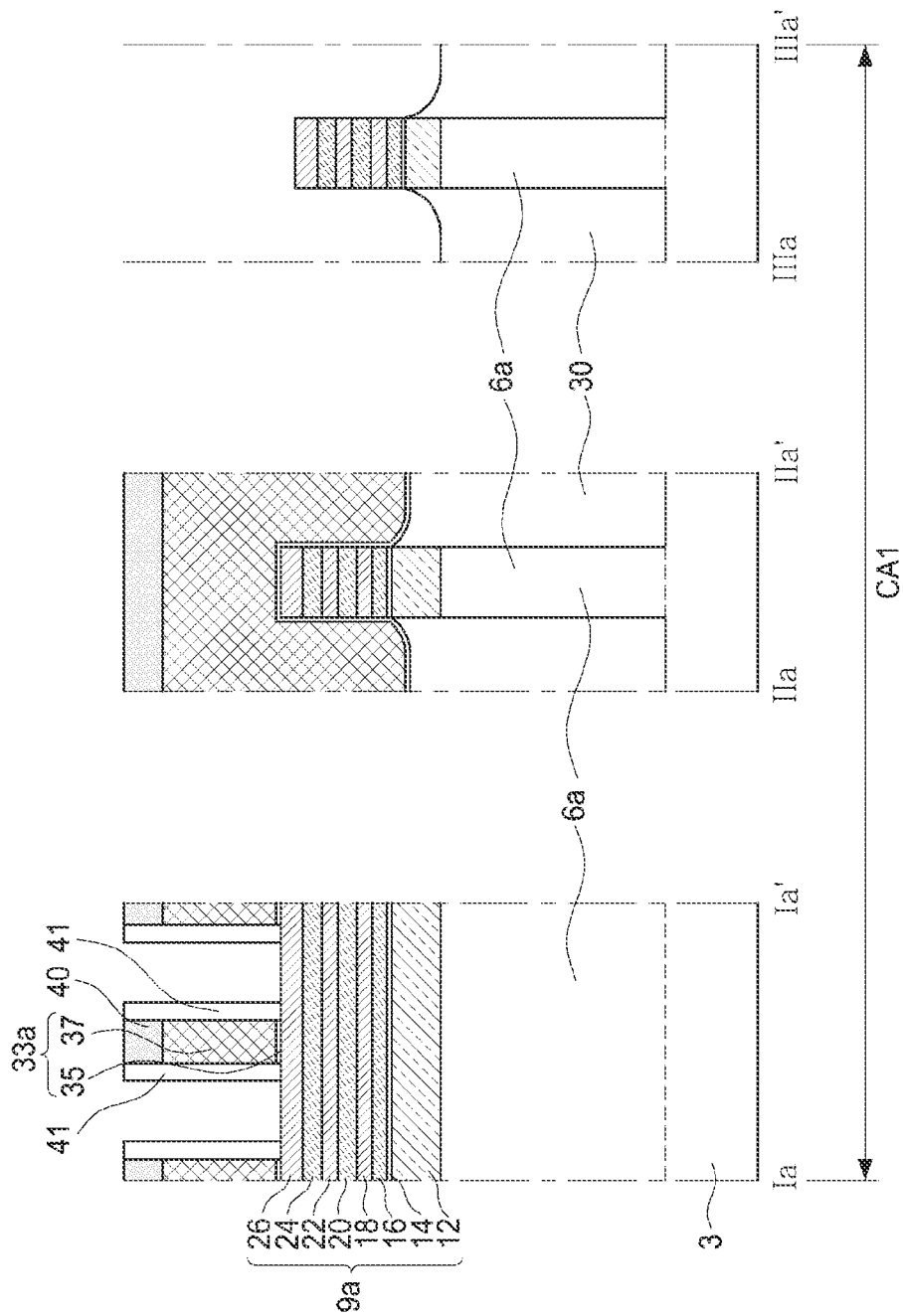
FIGS. 13A, 13B, 13C, 13D, 14, and 15 are cross-sectional views illustrating a method of fabricating semiconductor devices according to embodiments of the inventive concept.
Figure 13B:
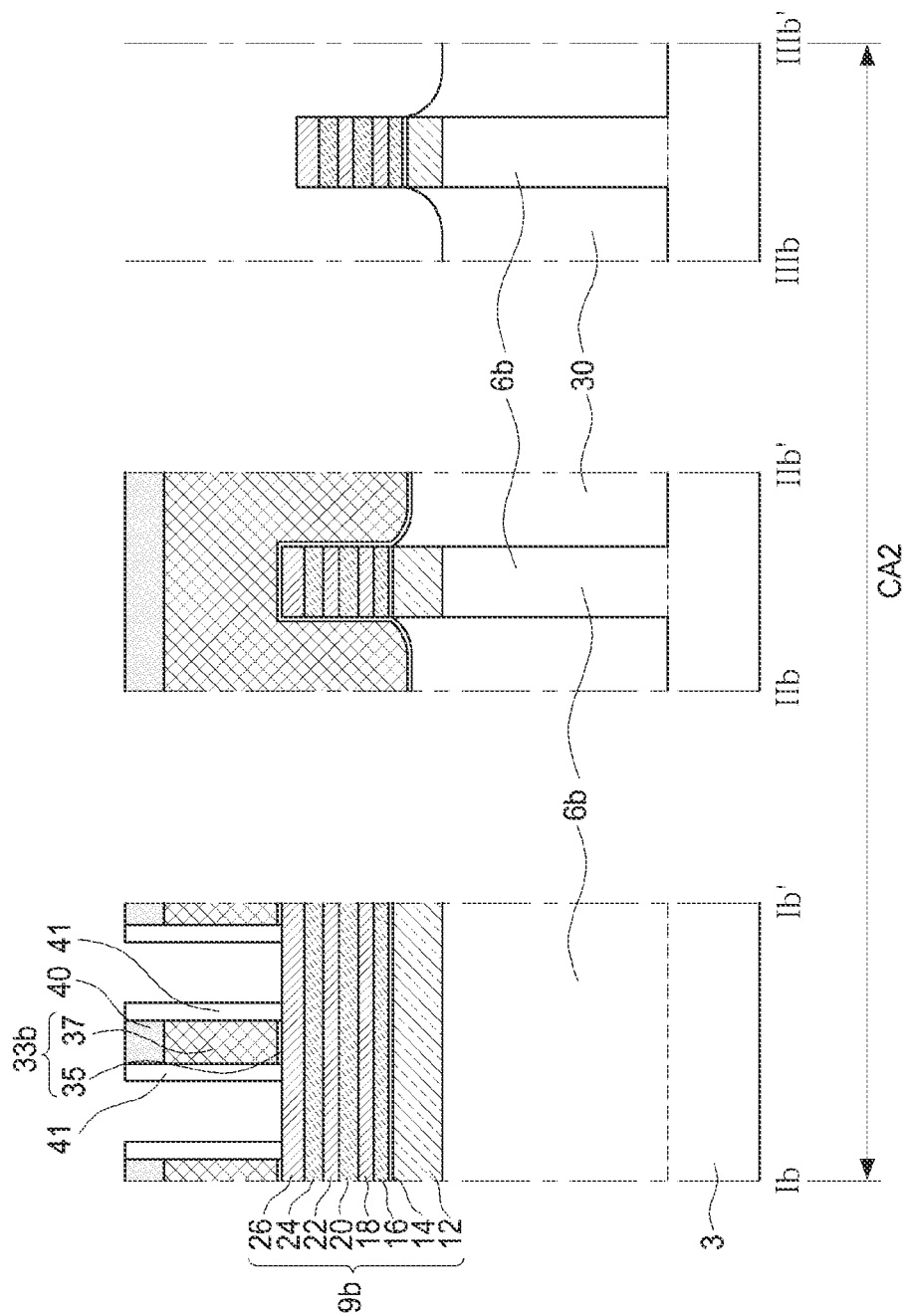
Figure 13C:
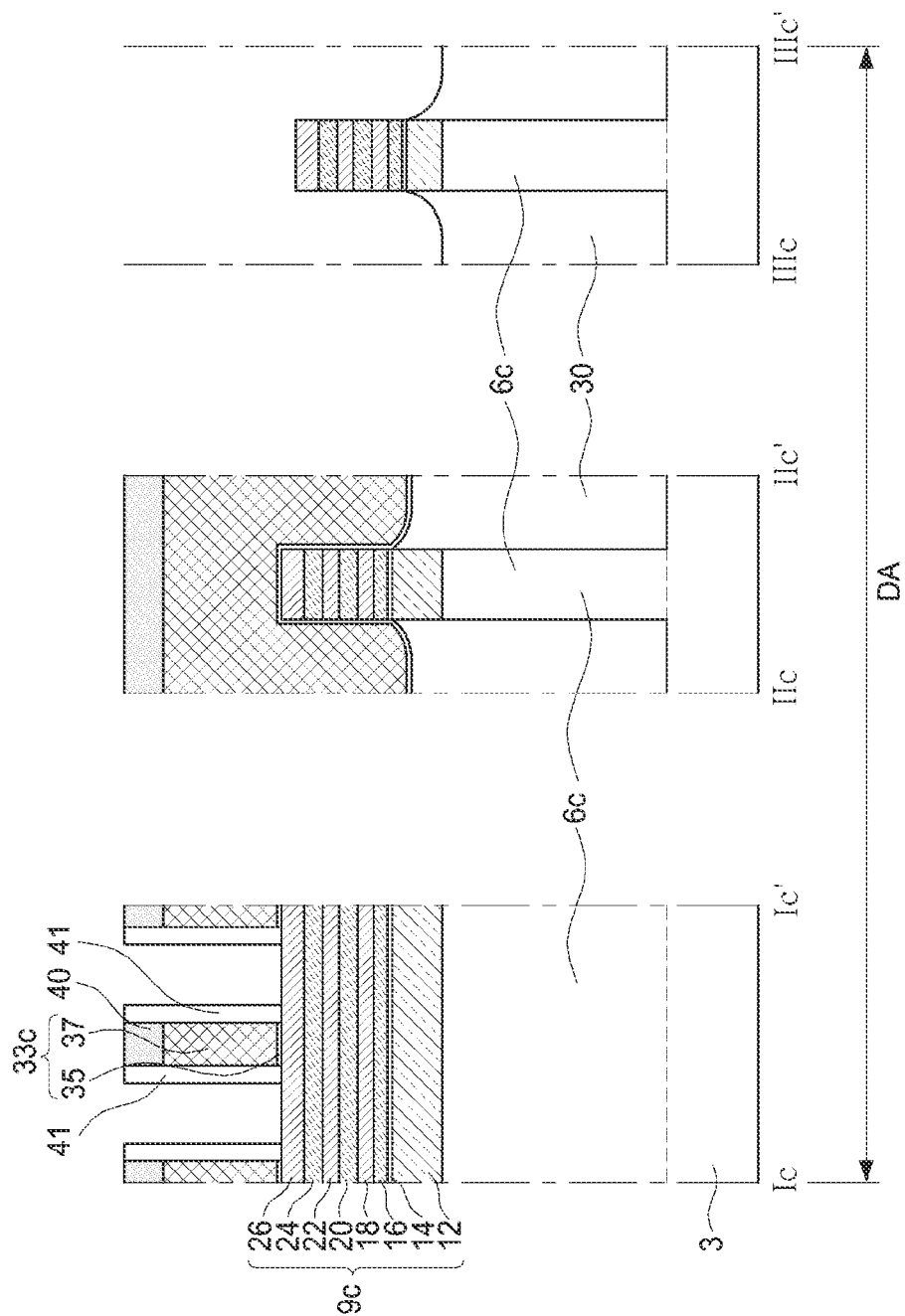
Figure 13D:
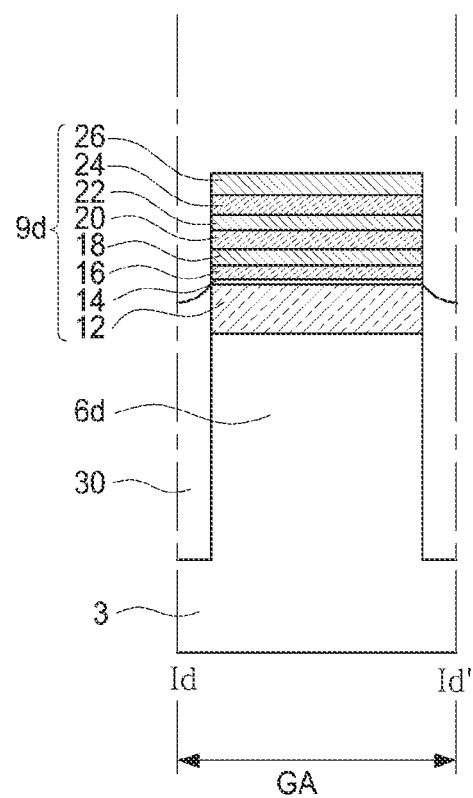

One example of a method of fabricating a semiconductor device according to embodiments of the inventive concept will be described in relation to FIGS. 12A, 12B, 13A, 13B, 13C, 13D, 14, and 15, wherein FIGS. 12A and 12B are flowcharts summarizing the exemplary method of fabricating a semiconductor device according to embodiments of the inventive concept, and FIGS. 13A, 13B, 13C, 13D, 14, and 15 are respective cross-sectional views variously illustrating method steps of the method of fabricating embodiments of the inventive concept. Here, among FIGS. 13A, 13B, 13C, 13D, 14, and 15, FIGS. 13A, 14, and 15 are cross-sectional views illustrating regions taken along lines Ia-Ia', IIa-IIa' and IIIc-IIIc' of FIG. 1, FIG. 13b is a cross-sectional view illustrating regions taken along the line Ib-Ib', IIb-IIb' and IIIb-IIIb' of FIG. 1, FIG. 13C is a cross-sectional view illustrating regions taken along lines Ic-Ic', IIc-IIc' of FIG. 1, and IIIc-IIIc', and FIG. 13D is a cross-sectional view illustrating a region taken along line Id-Id' of FIG. 1.

Referring to FIGS. 12A, 12B, 13A, 13B, 13C and 13D, a substrate 3 including circuit regions CA1 and CA2 and peripheral regions DA and GA may be prepared.

The circuit regions CA1 and CA2 may include a first circuit region CA1 and a second circuit region CA2. The peripheral areas DA and GA may include a dummy region DA and a guard ring region GA. The guard ring region GA may be referred to as a dam region.

A first well ion implantation process may be performed to form a first well region in a substrate 3 (S5). A second well ion implantation process may be performed to form a second well region in the substrate 3 (S10).

A lower barrier layer 12 may be formed on the substrate 3 (S15). An upper barrier layer 14 may be formed on the lower barrier layer 12 (S20). First semiconductor layers 16, 20, and 24 and second semiconductor layers 18, 22, and 26 may be formed to alternately and repeatedly stacked on the upper barrier layer 14 (S25).

The lower barrier layer 12 may be formed of a silicon-carbon (SiC) material by an epitaxial growth process. The upper barrier layer 14 may be formed of a silicon-germanium-carbon (SiGeC) material by an epitaxial growth process. The first semiconductor layers 16, 20, and 24 may be formed of a silicon-germanium (SiGe) material by an epitaxial growth process. The second semiconductor layers 18, 22, and 26 may be formed of a silicon (Si) material by an epitaxial growth process.

The upper barrier layer 14 may serve to improve flatness of the lower barrier layer 12. For example, in the SiGe material of the lowermost first semiconductor layer 16 among the first semiconductor layers 16, 20, 24, the upper barrier layer 14 may prevent germanium (Ge) elements from being diffused into the lower barrier layer 12 to improve the flatness of the lower barrier layer 12 and to prevent a thickness of the lowermost first semiconductor layer 16 from being changed.

The lower barrier layer 12, the upper barrier layer 14, the stacked first semiconductor layers 16, 20, and 24 and the second semiconductor layers 18, 22, 26 may constitute semiconductor structures 9a, 9b, 9c, and 9d.

The semiconductor structures 9a, 9b, 9c, and 9d may be referred to as a first circuit semiconductor structure 9a on the first circuit region CA1, referred to as a second circuit semiconductor structure 9b on the second circuit region CA2, referred to as a third circuit semiconductor structure 9c on the dummy region DA, and referred to as a guard ring semiconductor structure 9d on the guard ring region GA.

An isolation layer 30 may be formed (S30). The forming of the isolation layer 30 may include forming a trench extending downwardly through the semiconductor structures 9a, 9b, 9c, and 9d, and filling a portion of the trench with an insulating material.

Preliminary gates 33a, 33b, and 33c may be formed (S35). The preliminary gates 33a, 33b, and 33c may include a first circuit preliminary gate 33a formed on the first circuit region CA1, a second circuit preliminary gate 33b formed on the second circuit region CA2, and a dummy gate 33c formed on the dummy region DA.

Each of the preliminary gates 33a, 33b, and 33c may include a dielectric layer 35 and a gate layer 37 sequentially stacked. The gate layer 37 may include polysilicon. Mask layers 40 may be formed on the preliminary gates 33a, 33b, and 33c. Gate spacers 41 may be formed on side surfaces of the preliminary gates 33a, 33b, and 33c and the mask layers 40.

Figure 14:
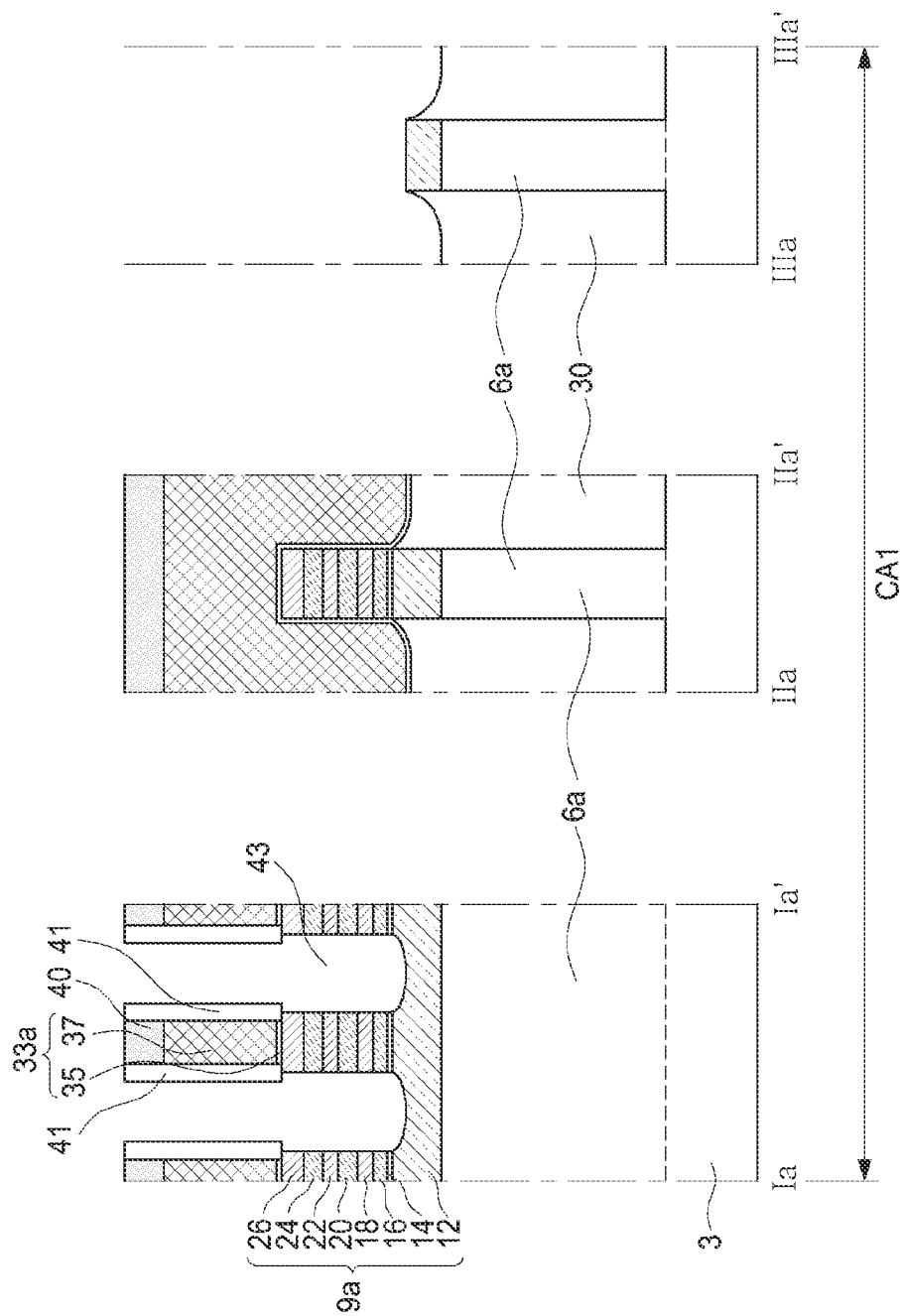

Referring to FIGS. 12A, 12B, and 14, first recess regions 43 may be formed using the mask layer 40 on the first circuit preliminary gate 33a and the gate spacers 41 on opposite sides adjacent to the first circuit preliminary gate 33a as etching masks to expose the lower barrier layer 12 of the first circuit semiconductor structure 9a through the first and second semiconductor layers 16, 18, 20, 22, 24, and 26 of the first circuit semiconductor structure 9a and the upper barrier layer 14, on the first circuit region CA. A portion of the lower barrier layer 12 may be etched.

Figure 15:
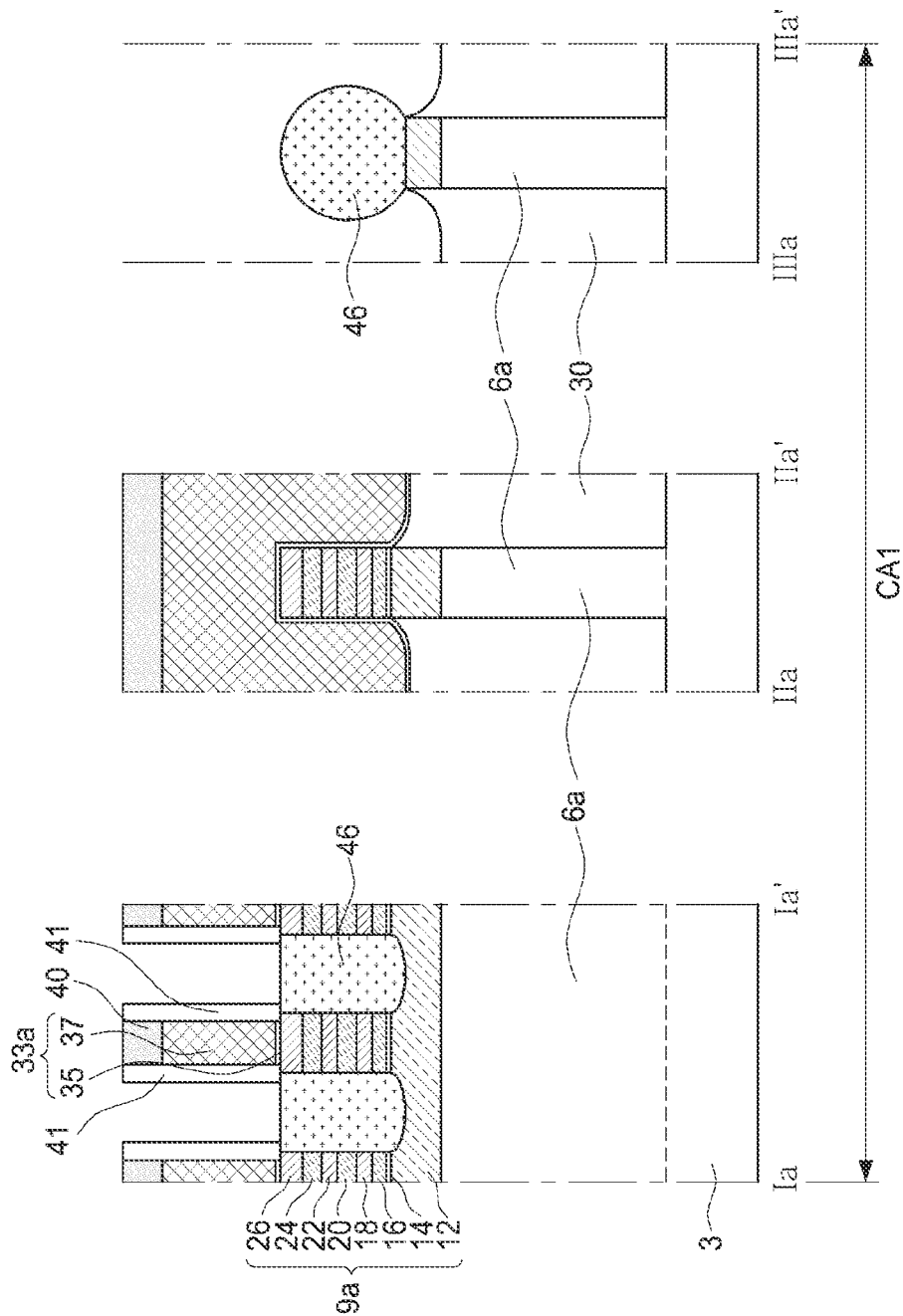

Referring to FIGS. 12B and 15, first source/drain regions 46 may be formed (S15). The first source/drain regions 46 may be formed by an epitaxial growth process, and may fill the first recess regions (43 of FIG. 14).

Returning collectively to FIGS. 2A, 2B, 3A, 3B, 4, 5 and 12B, second source/drain regions 48 may be formed (S45). The forming of the second source/drain region 48 may include forming second recess regions using the mask layer 40 on the second circuit preliminary gate 33b and the gate spacers 41 on opposite sides adjacent to the second circuit preliminary gate 33b as etching masks to expose the lower barrier layer 12 through the first and second semiconductor layers 16, 18, 20, 22, 24, and 26 of the second circuit semiconductor structure 9b and the upper barrier layer 14, on the second circuit region CA2, and performing an epitaxial growth process to fill the second recess regions with an epitaxial layer. The second recess regions 48 may be formed simultaneously with the first recess regions 43 described with reference to FIG. 14. The second source/drain regions 48 may be formed through an epitaxial growth process different from that of the first source/drain regions 46.

In an example, dummy source/drain regions 50 may be formed. The dummy source/drain regions 50 may be formed simultaneously with one of the first and second source/drain regions 43 and 46.

Then, an insulating liner 52 and an interlayer insulating layer 55 on the insulating liner 52 may be sequentially formed, and a planarization process may be performed to expose the gate layers 37 of the preliminary gates 33a, 33b and 33c while removing the mask layers 40.

During the planarization process, the mask layer 40 of the preliminary gate 33c may be removed while reducing a height of the preliminary gate (33c of FIG. 13C) and the preliminary gate 33c may be formed as a dummy gate 58c, on the dummy region DA. The dummy gate 58c may include a dummy gate dielectric layer 35a and a dummy gate electrode 37a on the dummy gate dielectric layer 35a. In the dummy region DA, the dummy gate 58c and the gate spacers 41 on side surfaces of the dummy gate 58c may constitute a dummy gate structure 32c.

The preliminary gates 33a and 33b on the circuit regions CA1 and CA2 may be removed to form grooves (S50). The upper barrier layer 14 and the first semiconductor layers 16, 20, and 24 on the circuit regions CA1 and CA2 may be removed to form empty spaces (S55). Circuit gates 58a and 58b may be formed in the empty spaces on the circuit regions CA1 and CA2 (S60).

The forming of the circuit gates 58a and 58b may include forming a first gate dielectric layer 60a on the first circuit region CA1, forming a second gate dielectric layer 60b on the second circuit region CA2, forming a first gate electrode 62a on the first circuit region CA1, and forming a second gate electrode 62b on the second circuit region CA2.

The first gate dielectric layer 60a and the first gate electrode 62a may constitute a first circuit gate 58a on the first circuit region CA1, and the second gate dielectric layer 60b and the second gate electrode 62b may constitute a second circuit gate 58b on the second circuit region CA2.

An etching process may be performed to lower upper surfaces of the circuit gates 58a and 58b and the gate spacers 41 on the first region CA1 and CA2, and gate capping patterns 39 may then be formed on the circuit gates 58a and 58b and the gate spacers 41.

The first circuit gate 58a, the gate spacer 41 on a side surface of the first circuit gate 58a, and the gate capping pattern 39 on the first circuit gate 58a and the gate spacer 41 may constitute a first gate structure 32a on the first circuit region CA1, and the second circuit gate 58b, the gate spacer 41 on a side surface of the second circuit gate 58b, and the gate capping pattern 39 on the second circuit gate 58b and the gate spacer 41 may constitute a second gate structure 32b on the second circuit region CA2.

Contact plugs 72a and 72b may be formed (S65).

The forming of the contact plugs 72a and 72b may include forming contact holes, penetrating through the interlayer insulating layer 55 and the insulating liner 52 and respectively exposing the first source/drain regions 46 and the second source/drain regions 48, and filling the contact holes with a conductive material.

A guard pattern 72d may be formed at the same time as the contact plugs 72a and 72b are formed. The guard pattern 72d may be in contact with the guard ring semiconductor structure 9d through the interlayer insulating layer 55 and the insulating liner 52.

As described above, a semiconductor device including a lower barrier layer disposed between source/drain regions and a fin may be provided. The lower barrier layer may serve to prevent leakage current generated from the source/drain regions to the fin. Accordingly, performance of the semiconductor device may be improved.

While embodiments have been shown and described above, it will be apparent to those skilled in the art that modifications and variations could be made without departing from the scope of the present inventive concept as defined by the appended claims.

What is claimed is:

1. A semiconductor device comprising:
   a first fin vertically protruding from a substrate and extending in a first horizontal direction;
   a second fin vertically protruding from the substrate;
   an isolation layer contacting side surfaces of the first fin and the second fin;
   a first lower barrier layer on the first fin;
   a second lower barrier layer on the second fin;
   source/drain regions spaced apart in the first horizontal direction on the first lower barrier layer;
   channel layers disposed between the source/drain regions and vertically spaced apart on the first lower barrier layer;
   a gate structure intersecting the first lower barrier layer, surrounding each of the channel layers, and extending in a second horizontal direction;
   an upper barrier layer on the second lower barrier layer; and
   alternately stacked first semiconductor layers and second semiconductor layers on the upper barrier layer.

2. The semiconductor device of claim 1, wherein each of the first lower barrier layer and the second lower barrier layer includes a first material,
the upper barrier layer includes a second material different from the first material,
the first semiconductor layers includes a third material different from the first material and the second material, and
the second semiconductor layers and the channel layers include a fourth material different from the first material, the second material, and the third material.

3. The semiconductor device of claim 2, wherein the first material is a silicon-carbon (SiC) material, the second material is silicon-germanium-carbon (SiGeC) material, the third material is silicon-germanium (SiGe) material, and the fourth material is silicon (Si) material.

4. The semiconductor device of claim 3, wherein a concentration of carbon (C) in the SiC material is in a range of 0.01 at % to 50 at %, and
a concentration of carbon (C) in the SiGeC material is in a range of 0.01 at % to 50 at %, and a concentration of germanium (Ge) in the SiGeC material is in a range of 0.01 at % to 50 at %.

5. The semiconductor device of claim 1, wherein the second lower barrier layer has a thickness greater than a thickness of the upper barrier layer.

6. The semiconductor device of claim 1, wherein a thickness of each one of the first lower barrier layer and the second lower barrier layer is in a range of 1 nm to 50 nm, and
a thickness of the upper barrier layer is in a range of 0.1 nm to 5 nm.

7. The semiconductor device of claim 1, wherein a lowermost one of the first semiconductor layers has a thickness greater than a thickness of the upper barrier layer.

8. The semiconductor device of claim 1, wherein a sum of a thickness of a lowermost one of the first semiconductor layers, and a thickness of the upper barrier layer is substantially the same as a thickness of a middle one of the first semiconductor layers.

9. The semiconductor device of claim 1, wherein a sum of a thickness of a lowermost one of the first semiconductor layers, and a thickness of the upper barrier layer is less than a thickness of the second lower barrier layer.

10. The semiconductor device of claim 1, wherein a sum of a thickness of a lowermost one of the first semiconductor layers, and a thickness of the upper barrier layer is less than a thickness of an uppermost one of the second semiconductor layers.

11. The semiconductor device of claim 1, wherein a thickness of an uppermost one of the channel layers is greater than a thickness of a lowermost one of the channel layers.

12. The semiconductor device of claim 1, wherein a thickness of the first lower barrier layer is greater than a thickness of a lowermost one of the channel layers.

13. The semiconductor device of claim 1, wherein a thickness of the first lower barrier layer is greater than a thickness of an uppermost one of the channel layers.

14. The semiconductor device of claim 1, wherein a maximum thickness of the first lower barrier layer overlaps the gate structure, and
a minimum thickness of the first lower barrier layer overlaps the source/drain regions.

15. A semiconductor device comprising:
a fin including a first material and protruding from a substrate;
a lower barrier layer including a second material and disposed on the fin;
source/drain regions spaced apart on the lower barrier layer in a first horizontal direction, and separated from the fin by the lower barrier layer;
channel layers, respectively including a third material, and disposed between the source/drain regions and vertically spaced apart on the lower barrier layer;
a gate structure including;
a lower gate portion contacting a lowermost one of the channel layers,
a middle gate portion disposed between adjacent ones of the channel layers, and
an upper gate portion disposed on an uppermost one of the channel layers; and
contact plugs on the source/drain regions,
wherein the second material of the lower barrier layer is different from the first material of the fin and the third material of the channel layers.

16. The semiconductor device of claim 15, wherein a maximum thickness of the lower barrier layer overlaps the lower gate portion, and
a minimum thickness of the lower barrier layer overlaps the source/drain regions.

17. The semiconductor device of claim 15, wherein the second material is a silicon-carbon (SiC) material, and
a thickness of the lower barrier layer is greater than a thickness of at least one of the channel layers.

18. The semiconductor device of claim 15, wherein the lower barrier layer contacts lower surfaces of the source/drain regions and a lower surface of the lower gate portion.

19. A semiconductor device comprising:
a fin protruding from a substrate;
a lower barrier layer on the fin;
source/drain regions spaced apart in a first horizontal direction on the lower barrier layer and separated from the fin by the lower barrier layer;
channel layers disposed between the source/drain regions and vertically spaced apart on the lower barrier layer;
a gate structure including a lower gate portion contacting a lowermost one of the channel layers, a middle gate portion disposed between adjacent ones of the channel layers, and an upper gate portion disposed on an uppermost one of the channel layers; and
contact plugs on the source/drain regions,
wherein an upper surface of the lower barrier layer has a wavy shape.

20. The semiconductor device of claim 19, wherein the upper surface of the lower barrier layer includes a first portion overlapping the lower gate portion, and second portions overlapping the source/drain regions and recessed to be lower than the first portion.

* * * * *